(12) United States Patent
Singer

(10) Patent No.: US 9,766,667 B1
(45) Date of Patent: Sep. 19, 2017

(54) COMPUTER CARD EJECTOR WITH LATCH

(71) Applicant: Juniper Networks, Inc., Sunnyvale, CA (US)

(72) Inventor: Richard W. Singer, Menlo Park, CA (US)

(73) Assignee: Juniper Networks, Inc., Sunnyvale, CA (US)

(*) Notice: Subject to any disclaimer, the term of this patent is extended or adjusted under 35 U.S.C. 154(b) by 0 days.

(21) Appl. No.: 15/233,810

(22) Filed: Aug. 10, 2016

(51) Int. Cl.
*G06F 1/18* (2006.01)
*H05K 7/14* (2006.01)

(52) U.S. Cl.
CPC ........... *G06F 1/185* (2013.01); *H05K 7/1409* (2013.01); *G06F 1/184* (2013.01)

(58) Field of Classification Search
CPC ...... H05K 7/14009; G06F 1/185; G06F 1/184
See application file for complete search history.

(56) References Cited

U.S. PATENT DOCUMENTS

| | | | | |
|---|---|---|---|---|
| 4,947,289 A * | 8/1990 | Dynie | ............... | H05K 7/1409 361/725 |
| 5,162,979 A * | 11/1992 | Anzelone | ............ | G06F 13/409 361/679.32 |
| 5,414,594 A * | 5/1995 | Hristake | ............ | H05K 7/1409 361/754 |
| 6,185,106 B1 * | 2/2001 | Mueller | ............ | H05K 7/1409 361/754 |
| 6,252,514 B1 * | 6/2001 | Nolan | .................. | G06F 1/183 340/686.4 |
| 6,754,074 B2 * | 6/2004 | McClelland, II | .... | H05K 7/1409 361/690 |
| 7,119,280 B1 | 10/2006 | Ray et al. | | |
| 7,301,777 B2 * | 11/2007 | Fan | .................. | G06F 1/184 361/679.55 |
| 7,408,788 B2 * | 8/2008 | Rubenstein | .......... | H05K 7/1409 361/754 |
| 7,510,416 B2 * | 3/2009 | Sato | .................. | H05K 7/1409 361/754 |
| 7,616,450 B2 * | 11/2009 | Karstens | ............. | H05K 7/1409 361/732 |
| 8,385,076 B2 * | 2/2013 | Peng | .................. | H05K 7/1401 248/200 |
| 8,611,103 B2 * | 12/2013 | Thomas | ............... | H05K 7/1411 361/679.58 |
| 8,902,601 B2 * | 12/2014 | Trotman | ............. | H05K 7/1402 361/679.38 |
| 9,042,104 B2 * | 5/2015 | Tsai | .................. | G06F 1/187 174/542 |

* cited by examiner

*Primary Examiner* — Lisa Lea Edmonds
(74) *Attorney, Agent, or Firm* — Shumaker & Sieffert, P.A.

(57) ABSTRACT

A card ejector comprising a pair of tapered lever arms coupled at a proximal end of the card ejector and coupled at a distal end of the card ejector, a cam block coupling the pair of tapered lever arms at the proximal end of the card ejector, the cam block operable to be rotatably coupled to a card and to engage a card cage, the cam block operable to urge the card into or out of the card cage when a rotational force is applied to the card ejector, and a latching mechanism coupling the pair of tapered lever arms at the distal end of the card ejector, the latching mechanism operable to automatically and releasably secure the distal end of the card ejector in a position near a face portion of the card by engaging an opening in the face portion.

22 Claims, 14 Drawing Sheets

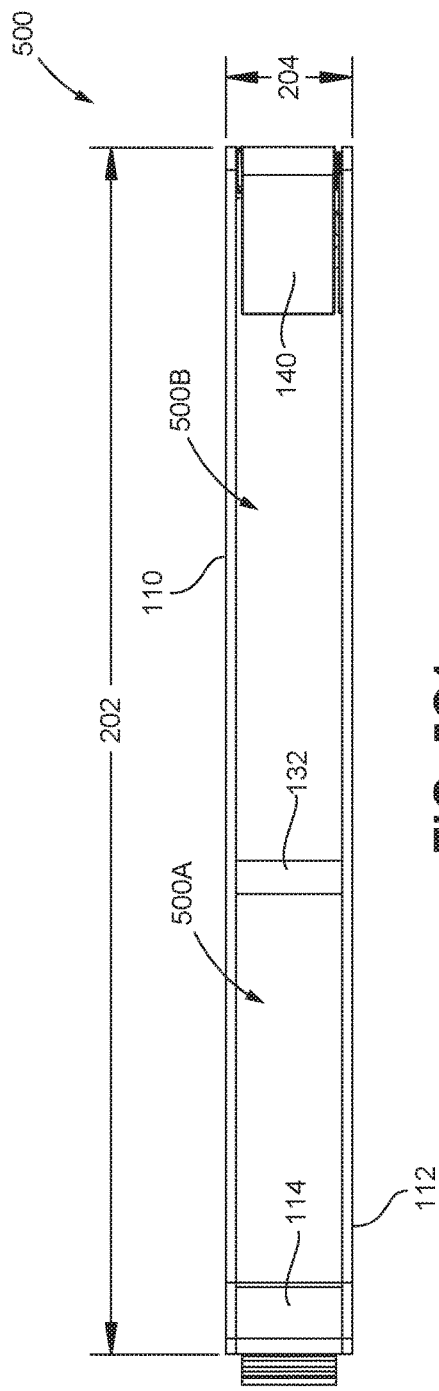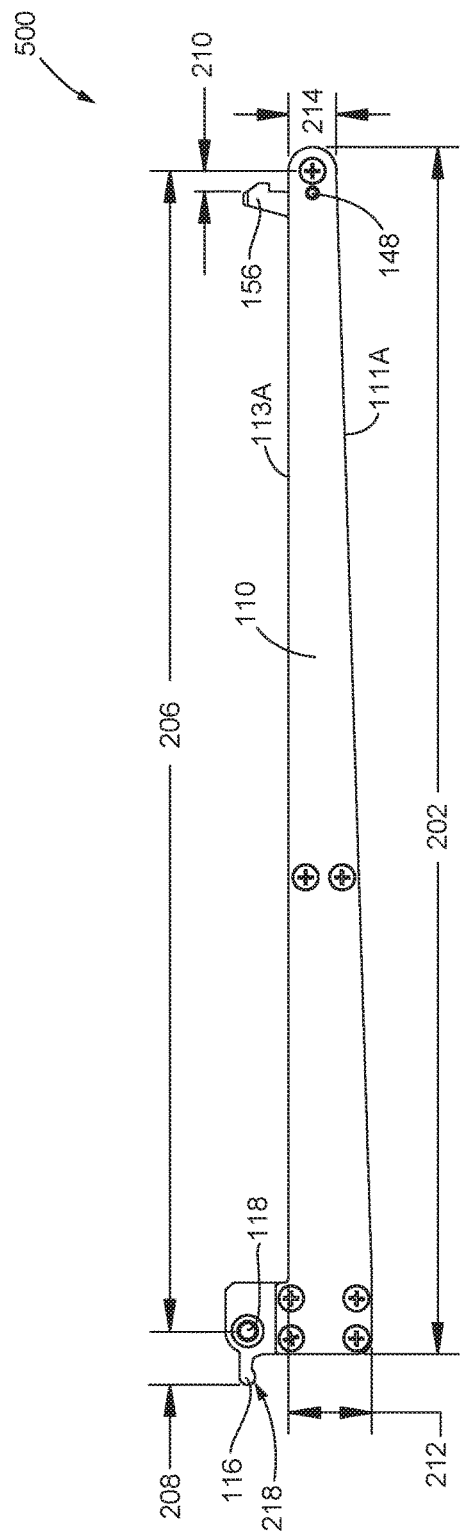
FIG. 5C1
FIG. 5C2

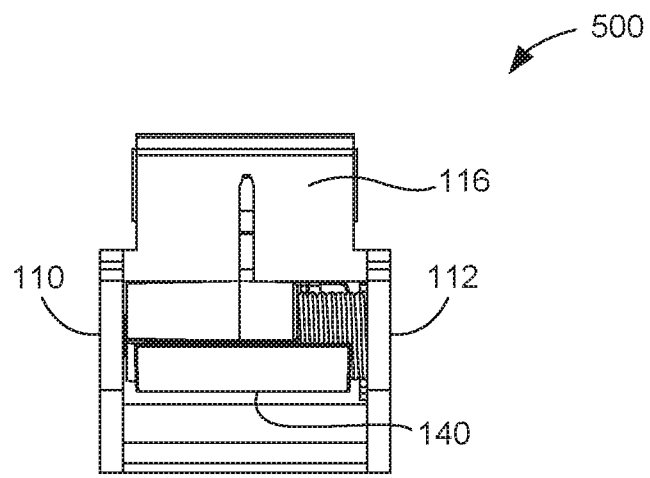
FIG. 5C3
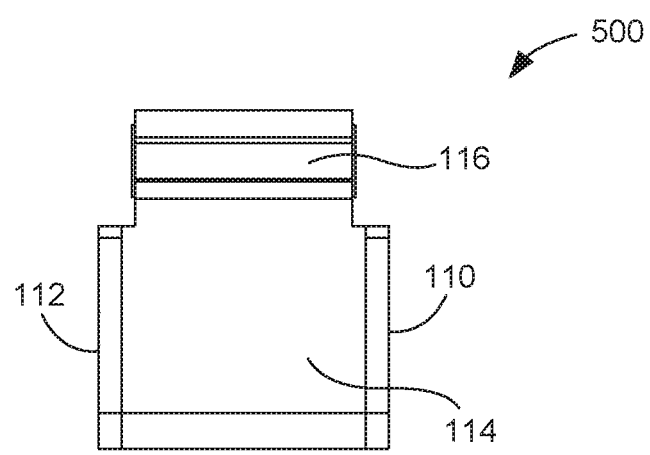
FIG. 5C4

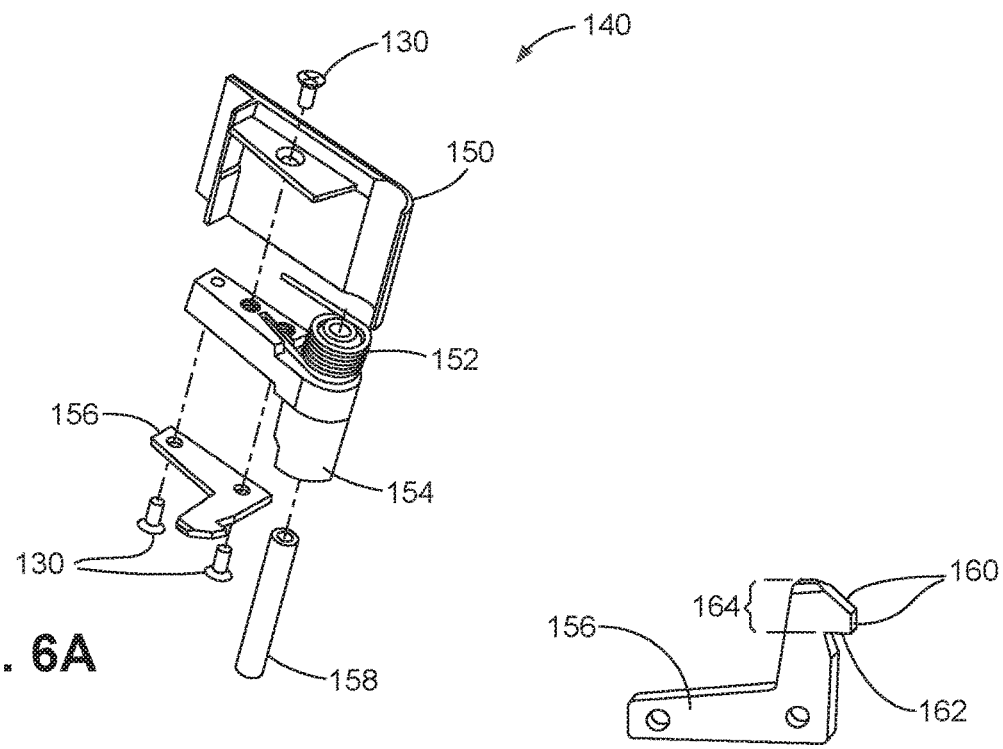
FIG. 6A
FIG. 6C
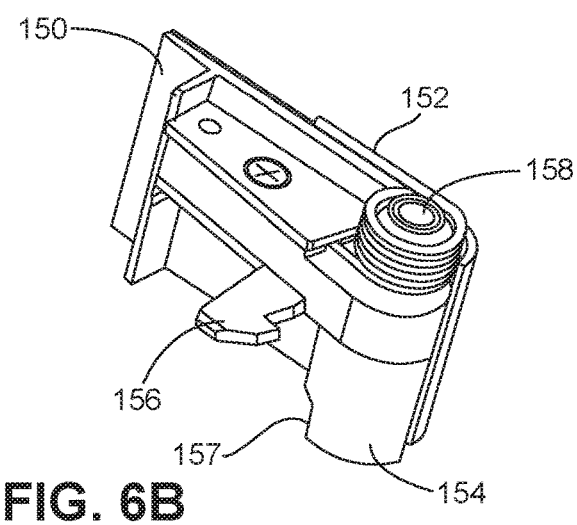
FIG. 6B

COMPUTER CARD EJECTOR WITH LATCH

TECHNICAL FIELD

The disclosure relates to devices, methods and systems for inserting, ejecting, and latching a computer card relative to a computer card rack system.

BACKGROUND

For larger computer systems, including mainframe computer, router, and server systems, electrical components and associated circuitry are often provided on a "card" consisting of at least one "circuit board" generally comprising a flat sheet-like material having a height and a width dimension, the material having a nominal thickness. Various electrical components are mounted to one or both sides of the circuit board. The internal connections between the components within the card are often formed using electrically conductive traces printed onto or otherwise provided on the material forming the circuit board.

Additional connections for electrical coupling of the components included within the card to devices or systems that are external to the card are often provided as conductive contacts formed along one edge of the circuit board of the card. Often, the contacts are configured such that the card may be releasably inserted into a card socket that also includes electrical connectors or terminals. The electrical connectors or terminals of the card socket may, in turn, be electrically coupled to the external devices or systems, such as other cards or any other types of electrical devices or systems, allowing the conductive contacts on the card to provide electrical connections to these external devices and systems through the card socket.

Card sockets may be provided as part of a computer chassis or rack system including what is often referred to as a "card cage." The card cage includes a rack like structure having a plurality of "slots," each slot configured to accept a card having the proper dimensions and conforming to any other physical parameters designated for cards designed to be accepted by the slot. A card having the proper form factor can be inserted into the slot, and, when fully inserted, engage the card socket provided for that particular slot, thus forming the electrical connections between the card and the devices and/or systems that are electrically connected to the contacts or terminals provide in the card socket. In some examples, the card and/or the card cage include(s) a mechanism to secure the card in place once the card has been fully inserted into a slot. In other examples, the card can also be removed from a slot after installation in order to service the card, thus allowing for replacement of a defective card, or simply to change the type of card provided by the system associated with the card cage.

In addition, a card may include additional components, such as indicator lights, displays including graphic displays, and connections such as a standardized port connection, that are located on a "face" portion of the card. A face of a card is often a narrow plate of some material, such as metal, that is mounted to the circuit board on an edge of the card opposite the edge of the card that includes the contacts that are configured to be releasably inserted into the card socket. In general, the additional components on the face of the card are visually and/or physically accessible once the card has been fully inserted into a slot of a card cage.

SUMMARY

In general, the invention is directed to a card ejector that may be mechanically coupled to a computer card or other types of electronic cards (e.g. "card" or "cards"), and allows for inserting, securing, and removing (ejecting) the card from a card socket, including card sockets associated with a slot configured to accept a computer or electronic card in a rack-like structure such as a card cage. Example systems and methods described herein provide a card ejector that provides leverage for exerting a force in a proper direction and to a predetermined extent on a card in order to insert the card into a slot and a card socket, and to comfortably overcome the resistance of the card being inserted into a card socket in a proper amount to overcome the insertion resistance without damaging the card or the card socket. Further, the card ejector may comprise a latching mechanism that automatically and quickly secures the card in the card socket without the use of a screw or other mechanisms that require addition manipulation by a user when inserting the card. In various examples, when the card ejector is fully actuated in inserting a card into a slot and associated card socket, the latching mechanism will automatically and releasably latch the card ejector to an opening in the face of the card without the need for any additional manipulation on the part of the operator inserting the card. In addition, when the card ejector has been fully actuated in inserting a card, a hook portion of the latching mechanism is configured to hold a pair of lever arms of the card ejector in a state of tension. As such, when the card ejector is rotated to the latching position, a pair of lever arms of the card ejector are held in tension, and the hook is configured as an over-center hook relative to a rotational point of the latching mechanism. Thus, the tension force generated in the lever arms applies a force to the over-center hook to rotate the over-center hook and the latching mechanism in a direction of locking against the front panel (instead of unlocking). As such, once the card ejector is latched in position, the over-center hook provides security against having the latching mechanism inadvertently unlatch due to vibration and/or mechanical shock.

Each of the pair of lever arms used to form each card ejector are tapered along a longitudinal axis of the lever arm. In some examples, a distal end of the lever arm is approximately half of the width of the proximal end of the lever arm. The taper of the lever arms allows for even distribution and a division of the forces applied to the card ejector along the longitudinal axis of each lever arm, and hence, provides elastic behavior over a greater deformation range of the lever arms. Further, the lever arms can be made of relatively thin material, such as metal, which provides resistance to material yield and consequent plastic deformation when rotational forces are applied to the card ejection in the process of inserting and extracting cards. Further, the design of these lever arms provides for easy manufacturing methods, such as stamping or laser cutting of the material used to form the lever arms, thus allowing for a low overall cost to manufacture a higher insertion force card ejector compared to existing designs for card ejectors.

As one example, the disclosure is directed to a device comprising: a card ejector comprising a pair of tapered lever arms coupled at a proximal end of the card ejector and coupled at a distal end of the card ejector; a cam block coupling the pair of tapered lever arms at the proximal end of the card ejector, the cam block rotatably coupled to a card and configured to engage a card cage, and urge the card into or out of the card cage when a rotational force is applied to the card ejector; and a latching mechanism coupling the pair of tapered lever arms at the distal end of the card ejector, the latching mechanism configured to automatically and releasably secure the distal end of the card ejector in a position near a face portion of the card by engaging an opening in the face portion.

As another example, the disclosure is directed to a method comprising: inserting a computer card into a slot of a card cage, the computer card comprising at least one card ejector comprising a pair of tapered lever arms and a cam rotatably coupled to the computer card; advancing the computer card into the slot to a position where the cam engages a cam engagement block mounted to the card cage; applying a rotational force to the pair of tapered lever arms in a direction toward a face portion of the card cage, the pair of tapered lever arms configured to transfer the rotational force through the cam to the cam engagement block to insert the computer card into a card socket located in the slot; advancing a latching mechanism located on a distal end of the at least one card ejector toward the face of the computer card to a position where the latching mechanism engages and latches to an edge of an opening in the face of the computer card; automatically securing, by a latching spring, the latching mechanism to the edge of the opening to secure the card ejector to the computer card in an inserted position within the slot forming an over-center latching arrangement between a hook and a rotational point of the latching mechanism.

As another example, the disclosure is directed to a latching system for a computer card comprising: a computer card; a siderail coupled to a first side of the computer card, a card ejector rotatably coupled to the first side rail, the card ejector comprising a pair of tapered lever arms coupled by a cam block at a first end of the card ejector, the cam block configured to engage a first cam engagement block of a card cage to urge the computer card into or out of the computer cage when a rotational force is applied to the card ejector, and a latching mechanism coupling the pair of tapered lever arms at a second end of the card ejector, the latching mechanism configured to automatically and releasably secure the second end of the card ejector in a position near the face portion of the computer card by placing the pair of tapered lever arms in tension when the latching mechanism has urged the computer card into an inserted position within the card cage.

The details of one or more examples of this disclosure are set forth in the accompanying drawings and the description below. Other features, objects, and advantages of this disclosure will be apparent from the description and drawings, and from the claims.

BRIEF DESCRIPTION OF DRAWINGS

FIG. 5C1-C4 include directional views illustrative of a card ejector in accordance with one or more example implementations and techniques described in this disclosure.

FIG. 6A is an exploded view illustrative of a latching mechanism in accordance with one or more example implementations and techniques described in this disclosure.

FIG. 6B is an assembled view illustrative of the latching mechanism illustrated in FIG. 6A and in accordance with one or more example implementations and techniques described in this disclosure.

FIG. 6C is a perspective view illustrative of a hook of the latching mechanism in accordance with one or more example implementations and techniques described in this disclosure.

Figure 1:
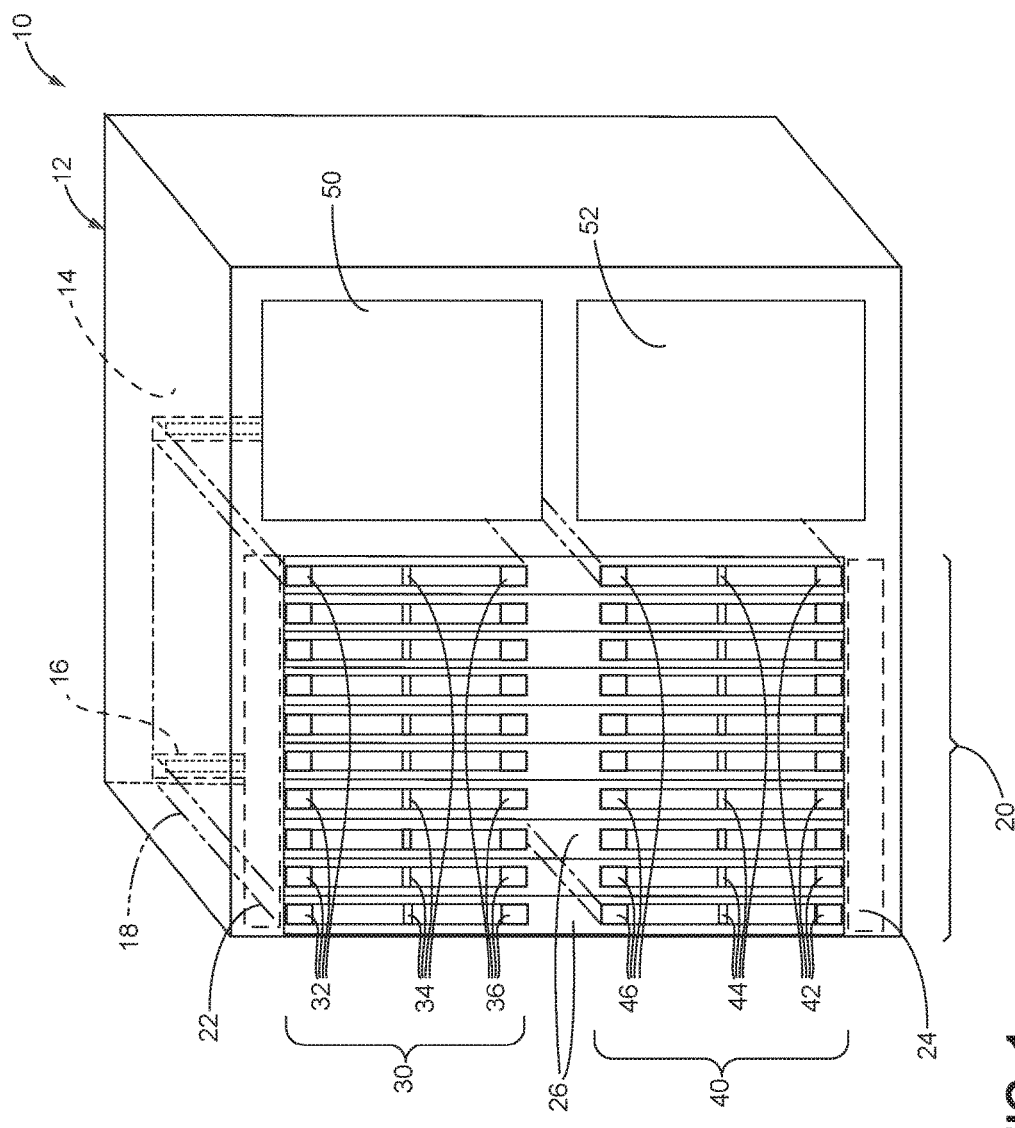
FIG. 1 is a perspective view illustrative of a computer rack including a plurality of computer cards inserted and latched within the computer rack in accordance with one or more example implementations and techniques described in this disclosure.

The drawings and the description provided herein illustrate and describe various examples of the inventive methods, devices, and systems of the present disclosure. However, the methods, devices, and systems of the present disclosure are not limited to the specific examples as illustrated and described herein, and other examples and variations of the methods, devices, and systems of the present disclosure, as would be understood by one of ordinary skill in the art, are contemplated as being within the scope of the present application.

DETAILED DESCRIPTION

In general, the invention is directed to systems and methods of inserting, securing, and removing (i.e., ejecting) computer or electronic cards from a card socket, including card sockets associated with a slot configured to accept a card in a chassis or rack-like structure including a card cage. As recognized herein, as the dimensions of cards have increased, and the number and types of electrical connections included on a given card have increased, the force required to fully and properly insert a card into a corresponding card socket has become quite large, in some examples on the order of 600 Ft/lbs. of force. In addition, if a card is inserted with too much force, or force is applied to the card at improper directions (e.g., bending or twisting forces), the card can be damaged or can create a condition called "over-insertion." In the case of over-insertion, the forces placed on the card during the insertion process, and in some instances remaining on the card and/or card socket after insertion, may damage the contacts on the card and/or card socket.

The use of too much force during card insertion or an over-insertion condition resulting upon insertion can create warpages or other physical distortions in the card and/or in the card socket. The warpages or other physical distortions can cause some or all of the proper connections between the card and the card socket to not be electrically formed, or to be improperly formed and create electrical issues such as high resistance connections. These conditions may result in immediate malfunction or improper function of the card, or may result in a card or system failure at some later time. In addition, the use of excessive force or improper techniques in removing (i.e., ejecting) a card from a slot can also result in damage to the card and/or to the card socket. Further, a card in general needs to be securely fixed in the slot of a card cage once the card has been fully inserted, and should not be able to move or be partially or totally ejected from the card socket due to vibration and/or temperature fluctuations caused by environmental factors or operation of the card during the time a card is intended to remain inserted in the card socket.

Example systems and methods described herein provide a card ejector that provides leverage for exerting a force in a proper direction and to a predetermined extent on a card in order to overcome the insertion resistance, and allow for insert the card into a slot and a card socket without causing damage or forming improper electrical connections. Further, the card ejector may comprise a latching mechanism that automatically and quickly secures the card in the card socket without the use of a screw or other mechanisms that require addition manipulation by a user when inserting the card. In various examples, when the card ejector is fully actuated in inserting a card into a slot and an associated card socket, the latching mechanism will automatically and releasably latch the card ejector to an opening in the face of the card without the need for any additional manipulation on the part of the operator inserting the card.

Once a card is fully inserted into a card slot and the card ejector is in the fully latched position, the card ejector includes one or more spaces that allow access, both physically and visually, to one or more components located on the face of the card. Visual access to the face of a card allows inspection of various indicator(s) and display devices located on the face of the card and that may be associated with the operation of the card or the state of the card, the card socket, the card rack, and/or any additional cards or external devices coupled to the card through the card socket into which the card has been inserted. Access to ports and other connections on the face of the card allows additional devices to be connected to and disconnected from the card without having to remove the card from the card socket or card rack, which, in some examples, allows the card to continue to be powered and operational while making and removing these connections.

In addition, the card ejector provides a simple mechanism to release the latching mechanism when removing the card, and provides leverage for exerting a proper force on the card to remove (i.e., eject) the card from the card socket and the slot. In various examples, when the card ejector is in the fully latched position and latching a card that is fully inserted into a slot of a card cage, the latching mechanism is held in tension so that the distal end of the card ejector experiences a force trying to move the distal end in a direction away from the face of the card, but is held in place by the latching mechanism. A simple movement of a latch release mechanism unlatches the distal end of the latching mechanism from the face of the card, allowing the tension to move the card ejector away from the face of the card, creating an access space between the latching mechanism and the face of the card. The access space is sufficient to allow an operator to access an underside of the latching mechanism and to then exert a rotational force on the underside of latching mechanism in a direction away from the face, which is transferred as a proper force to the card that allows the card to be removed (i.e., ejected) from the card socket without damaging the card or the card socket.

In addition, the latching mechanism of the card ejector includes a hook portion configured in an over-center arrangement relative to the rotational axis of the latching mechanism. When the card ejector is in the latched position and the latching mechanism is fully engaged and latched with face of a card, the force (tension) in the lever arms of the card ejector that is trying to move the card ejector in the direction away from the face portion of the card forces the over-center hook and the latching mechanism rotationally in the direction of latching the over-center hook as opposed to rotating in the direction that would unlatch the latching mechanism from the face portion of the card. This feature provided by the over-center hook provides additional security against unintentional unlatching of the card ejector.

In addition, as further described below the card ejector is assembled from easily manufactured parts, in various examples from inexpensive materials, and thus provides a low cost card ejector system that offers all of the features described herein while being simple to manufacture and assemble.

As described herein, the terms "associated" and "associated with" generally refer to parts or devices that are physically coupled to one and other, either releasable or permanently, or that are arranged to be brought into contact with one and other through the operation of the devices and systems as described herein. For example, as described herein a card socket is "associated with" a slot in a card cage, wherein the card socket is positioned so that when a (computer or electronic) card is fully inserted into a particular slot of the card cage, the card positioned in that slot will be brought into physical contact and electrical connection with the card socket that is "associated with" that slot. In other examples, a card ejector that is "associated with" a card in general is physically attached or otherwise fastened at some portion of the card ejector to that particular card. A latching mechanism, a spacer, a cam block, and/or a cam that is described herein as "associated with" a card ejector is, in general, permanently coupled to and forms a part of that card ejector. Further, the terms "card" and "electronic card" and "computer card" may be used interchangeably throughout the disclosure, and are not intended to be limited to any particular type of electronic circuits or to any particular configurations for components provided on a card designed to be releasably inserted into a card rack or card cage.

FIG. 1 illustrates a block diagram of an example card rack system 10 comprising a plurality of cards 26 secured within the card rack system. As illustrated, card rack system 10 includes a card cage 12 comprising a card rack area 20 configured to house a plurality of electronic and/or computer cards 26. As noted above, the terms "card" or "cards" 26 are not limited to any particular type of cards, and can include any type of electronic devices mounted on a substrate or other medium, such as a circuit board, wherein the cards are physically configured to be installed in a position within the card rack area 20 of card cage 12.

Card cage 12 includes vertically aligned tracks or grooves forming individual slots 18 configured to allow insertion and removal of each of the plurality of computer cards 26 to and from, respectively, the card cage 12. In general, one computer card 26 is configured to be inserted into one of slots 18 in the card cage 12, a slot defined by the tracks or grooves arranged for guiding the insertion and removal of a card into and out of, respectively, a given one of slots 18 in card rack area 20 of card cage 12. Card cage 12 includes a back side having an interior surface 14 onto which a plurality of card sockets 16 are mounted. Each card socket 16 includes a plurality of electrical contacts, and is mounted on the interior surface 14 of the back side of the card cage 12 in a position so as to engage electrical contacts or terminal of a card 26 that is installed into the particular slot of card rack area 20 that is associated with that card socket 16. When a card 26 is fully inserted into a slot 18 located in card rack area 20, a card socket 16 associated with that slot is configured to engage the electrical contacts or terminals on that particular card, and to provide electrical connections between the card and the electrical contacts or terminals included in the card socket associated with that slot. As would be understood by one of ordinary skill in the art, each of card sockets 16 may be wired to other sockets, and/or one or more other device(s) included within card rack system 10, and/or to external devices, busses, or other electrical and/or computer systems and devices (not shown in FIG. 1) to provide electrical connections between the devices located on the cards 26 installed in card cage 12 and other cards 26 and/or the systems and devices located externally to the card rack system 10.

Card cage 12 includes an upper cam engagement block 22 that is secured to card cage 12 in an area above the openings in card rack area 20 where cards 26 can be inserted and removed, and a lower cam engagement block 24 that is secured to the card cage 12 in an area below the openings in the card rack area 20 where the computer cards 26 can be inserted and removed. As illustrated in FIG. 1, each of cards 26 include an upper card ejector 30 and a lower card ejector 40. Each of the upper card ejectors 30 include a cam block 32 and a latching mechanism 36, wherein each of the lower card ejectors 40 include a cam block 42 and a latching mechanism 46.

Each of the cam blocks 32 of the upper card ejectors 30 are configured to engage upper cam engagement block 22 in order to allow the upper card ejector 30 associated with a particular cam block 32 to, when operated as described herein, exert force on a computer card 26 coupled to the particular cam block 32 being inserted or removed (ejected) from the card rack 12. Similarly, each of the cam blocks 42 of the lower card ejectors 40 are configured to engage the lower cam engagement block 24 in order to allow the lower card ejector 40 associated with a particular cam block 42 to, when operated as described herein, exert force on a computer card 26 coupled to the particular cam block 42 being inserted or removed (ejected) from the card cage 12.

In addition, once a card 26 has been fully inserted into a slot in card rack area 20, the upper card ejector 30 is configured so that a latching mechanism 36 that is associated with that particular card ejector may latch the upper card ejector 30 in place, as illustrated in FIG. 1, and secure the card 26 in the fully inserted position relative to card cage 12 and a card socket 16 located on the interior surface 14 of the card cage. When upper card ejector 30 is latched in the latched position as shown in FIG. 1, cam block 32 remains engaged with the upper cam engagement block 22, and secures card 26 in place within card cage 12. Similarly, once the card 26 has been fully inserted into a slot in card rack area 20, the lower card ejector 40 is configured so that a latching mechanism 46 that is associated with that particular card may latch the lower card ejector 40 in place, as illustrated in FIG. 1, and secure the card 26 in the fully inserted position relative to card cage 12 and interior surface 14 of the card cage. When the lower card ejector 40 is latched in the latched position as shown in FIG. 1, cam block 42 remains engaged with the lower cam engagement block 24, and secures card 26 in place within card cage 12.

Each of latching mechanisms 36 and 46 are configured to provide an over-center latching feature, further described herein, such that when the card ejector comprising the latching mechanism 36, 46 is fully engaged and in the latched position, an over-center hook of the latching mechanism provides over-center latching at the distal end of the card ejector. Each of latching mechanisms 36 and 46 are also configured to be releasable latched to a card 26 associated with the card ejector to which the latching mechanism is mechanically coupled. When a latching mechanism 36 is operated to be unlatched from a card 26 while the card is fully inserted in a slot 18 of card cage 12, upper card ejector 30 associated with that latching mechanism is configured to be operated, as further described herein, to exert a force on the card 26 to move (extract) the card in a direction away from the card socket 16 in which the card is inserted, and eventually to be disconnected from and removed from the card socket 16 and the card cage 12. Similarly, when a latching mechanism 46 is operated to be unlatched from a card 26 while the card 26 is fully inserted in a slot of card cage 12, the lower card ejector 40 associated with that latching mechanism 46 is configured to be operated, as further described herein, to exert a force on the card 26 to move (extract) the computer card in a direction away from the card socket 16, and eventually to be disconnected from and removed from card socket 16 and the card cage 12.

As shown in FIG. 1, upper card ejector 30 include a spacer 34 that couples to each of and separates a pair of lever arms (see e.g., lever arms 31, 33 shown in FIG. 3), comprising the upper card ejector 30. Spacer 34 is configured to add strength and mechanical stability to the upper card ejector 30 while creating space between the pair of lever arms that allows for access to the face portion of the card 26 even when the upper card ejector 30 is in the latched position as shown in FIG. 1. Similarly, as shown in FIG. 1 lower card ejector 40 includes a spacer 44 that couples to each of and separates a pair of lever arms (see e.g., lever arms 31, 33 shown in FIG. 3), comprising the lower card ejector 40. Spacer 44 is configured to add strength and mechanical stability to the lower card ejector 40 while creating space between the pair of lever arms that allows for access to the face portion of the card 26 that is adjacent to lower card ejector 40 even when the lower card ejector is in the latched position as shown in FIG. 1.

The card ejectors 30 and 40 as described above have been referred to as the "upper" card ejector 30 and the "lower" card ejector 40. However, this does mean that card ejector 30 must always be positioned "above" card ejector 40 when a card comprising card ejectors 30 and 40 is installed in a card cage. In some examples, the card ejectors 30 and 40 are arranges so that a card ejector 40 could be inserted in a slot of card cage 12 so as to be in a position above card ejector 30 for that particular card. However, as would be understood by one of ordinary skill in the art, the arrangement of other devices on the card, such as the electrical connectors on the card configured to engage a card socket on the interior surface 14 of the card cage 12, or for example the orientation of devices located on the face of the card, may dictate a particular orientation of the card relative to which of card ejectors 30 and 40 is above the other when the card is properly inserted in the slot. Other forms or polarization (not shown in FIG. 1) may be employed as part of the card rack system 10 to prevent improper orientation of a card inserted into the card cage without adverse effect on the operation of the card ejectors described herein or the equivalents thereof. Also, while the cards 26 as illustrated in FIG. 1 are shown having a vertical orientation, examples of card having the card ejectors described herein are not limited to a particular orientation, and may be provided and are operational using card rack systems having other orientations for cards inserted into the card rack areas of the card cages, including but not limited to cards having horizontal orientations.

In various examples, card cage 12 may include one or more additional areas 50, 52 located for example adjacent to card rack area 20. Additional areas 50, 52 may be used for securing additional devices, such as visual display panels, indicator lights such as light emitting diodes (LEDs), connectors for making additional electrical connections between cards 26 and devices external to card cage 12, or additional slots for more electronic and/or computer cards. The numbers, types, and configuration of the devices that may be included within or secured in additional areas 50, 52 are not limited to any particular numbers, types or configurations of devices, and can be any such devices and arrangements of devices as would be understood by one of ordinary skill in the art related to electronic and/or computer systems and electronic and/or computer hardware devices.

In various examples, card rack assembly 10 may be a stand along unit, or may be one portion or unit associated with a larger rack assembly system, wherein card rack system 10 may be stacked and/or attached to other racks or units so as to be above or below these other rack assemblies or units (not shown in FIG. 1), or other types of electrical and/or computer equipment, such as but not limited to power supplies, printers, displays, keyboards, and/or keypads, and/or one or more addition rack(s) configured to house additional card cage(s).

Figure 2:
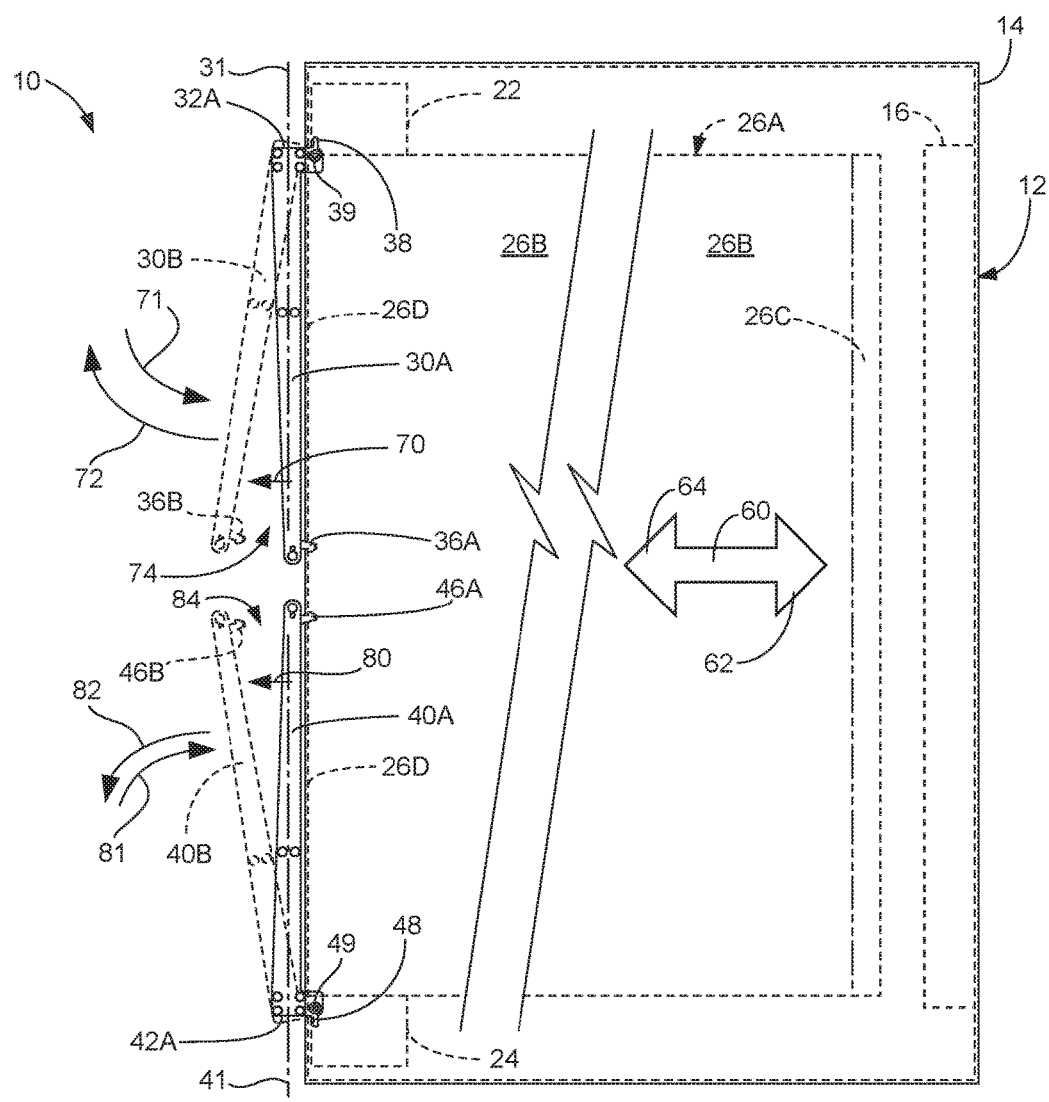
FIG. 2 is a side view illustrative of a computer rack illustrating various positions for card ejectors in accordance with one or more example implementations and techniques described in this disclosure.

FIG. 2 is a side view illustrative of the computer rack system 10 illustrating various positions for card ejectors in accordance with one or more example implementations and techniques described in this disclosure. As illustrated, card rack 12 includes upper cam engagement block 22 and lower cam engagement block 24 that are secured to card cage 12 in a location at a front side of card cage 12 opposite interior surface 14. Illustrative card ejector 30A is shown in a latched position, wherein latching mechanism 36A associated with card ejector 30A is engaged with and latched to a front surface 26D of a card 26A. The card ejector 30A is rotatably coupled to card 26A at a proximal end of the card ejector through cam block 32A. Illustrative card ejector 30B shows the card ejector in one possible unlatched position, wherein card ejector 30B is rotated about pin 39 of cam block 32A so that latching mechanism 36A, located at a distal end of the card ejector, is no longer engaged with or latched to the front surface 26D of card 26A. Because the card ejector is rotatably coupled to card 26A through cam block 32A, the card ejector can be operated to move between the unlatched position of illustrative card ejector 30B to the latched position of illustrative card ejector 30A, and then released, as further described herein, to allow the card ejector to again assume an unlatched position illustratively shown by card ejector 30B.

Similarly, illustrative card ejector 40A is shown in a latched position, wherein latching mechanism 46A associated with card ejector 40A is engaged with and latched to a front surface 26D of a card 26A. The card ejector is rotatably coupled to card 26A at a proximal end of card ejector through cam block 42A. Illustrative card ejector 40B shows the card ejector in one possible unlatched position, wherein card ejector 40B is rotated about pin 49 of cam block 42A so that latching mechanism 46A, located at a distal end of the card ejector, is no longer engaged with or latched to the front surface 26D of card 26A. Because the card ejector is rotatably coupled to card 26A through cam block 42A, the card ejector can be operated to move between the unlatched position of illustrative card ejector 40B to the latched position of illustrative card ejector 40A, and then released, as further described herein, to allow the card ejector to again assume an unlatched position illustratively shown by card ejector 40B.

As illustrated in FIG. 2, card 26A includes a case 26B, forming a body of the card 26A coupled to the front portion 26D, and an area 26C along an edge of card 26A opposite the front portion. Area 26C comprising one or more electrical connectors or terminals configured to be inserted into the card socket 16 associated with a slot into which card 26A is being inserted in order to form physical and electrical connections between area 26C of card 26A and the associated card socket 16. When card 26A is initially inserted into card cage 12, the card can be advanced in the direction indicated by arrow head 62 of arrow 60 with little or no resistance while the card is moving along the slot in troughs or grooves provided by the card rack, (e.g., as described above with respect to FIG. 1), and while area 26C has not yet come into contact with card socket 16. As some point as card 26A is being inserted further into the slot and before or just as area 26C is making initial contact with card socket 16, cam block 32A of card ejector 30A, B has been advanced to a position to allow cam 38 to come into contact with and to engage upper cam engagement block 22. The card ejector at this point is in an unlatched position, such as the position illustrate in FIG. 2 by card ejector 30B. At this same point in the insertion process, cam block 42A of card ejector 40A, B has been advanced to a position to allow cam 48 to come into contact with and to engage lower cam engagement block 24. The card ejector at this point is in an unlatched position, such as the position illustrated in FIG. 2 by card ejector 40B.

When cam 38 has been advanced toward upper cam engagement block 22 to a position to allow cam 38 to contact and engage the upper cam engagement block 22, a rotational force applied to card ejector 30B in a direction illustrated by arrow 71, can be used to rotate the card ejector so that the distal end and the latching mechanism 36A is moved toward the face portion 26D of card 26A. The rotational force illustrated by arrow 71 is transmitted through the card ejector to cam 38, and thus to upper cam engagement block 22, providing leverage to pull card 26A in the direction indicated by arrowhead 62, wherein the leverage afforded through the longitudinal axis of the card ejector provides a mechanical advantage for overcoming the force required to fully insert area 26C of card 26A into card socket 16. When card ejector 30B is advanced to assume the latched position shown by card ejector 30A, latching mechanism 36A is configured to engage and latch to the front portion 26D of card 26A. When latching mechanism 36A is latched to front portion 26D, cam 38 remains engaged with the upper cam engagement block 22, and thus prevents card 26A from moving in a direction out of the slot (e.g., in a direction indicted by arrowhead 64). Such unwanted or unintended movement in the direction of arrowhead 64 during times when the card is intended to be fully inserted into the slot may be caused by vibration or other environmental factors. When the card ejector is in the latched position illustrated by card ejector 30A, a tension along a longitudinal axis of the card ejector 30A is generated in the card ejector, the tension generating a static force illustrated by arrow 70 that would tend to move the distal end and the latching mechanism 36A in a direction away from face portion 26D of card 26A, but is unable to do so due to the retention force of the latching mechanism 36A being engaged with and latched to the face portion 26D of the card.

Similarly, when cam 48 has been advanced toward the lower cam engagement block 24 to a position to allow cam 48 to contact and engage the lower cam engagement block 24, a rotational force, applied to card ejector 40B in a direction illustrated by arrow 81, can be used to rotate the card ejector so that the distal end and the latching mechanism 46A is moved toward the face portion 26D of card 26A. The rotational force illustrated by arrow 81 is transmitted through the card ejector to cam 48, thus to cam engagement block 24, providing leverage to pull card 26A in the direction indicated by arrowhead 62, wherein the leverage afforded through the longitudinal axis of the card ejector provides a mechanical advantage for overcoming the force required to fully insert area 26C of card 26A into card socket 16. When card ejector 40B is advanced to assume the latched position shown by card ejector 40A, latching mechanism 46A is configured to engage and latch to the front portion 26D of card 26A. When latching mechanism 46A is latched to front portion 26D, cam 48 remains engaged with cam engagement block 24, and prevents card 26A from moving in a direction out of the slot in a direction indicted by arrowhead 64. Again, such unwanted or unintended movement in the direction of arrowhead 64 during times when the card is intended to be fully inserted into the slot may be caused by vibration or other environmental factors. When the card ejector is in the latched position illustrated by card ejector 40A, a tensional force along longitudinal axis is generated in the card ejector, the tensional force generating a static force illustrated by arrow 80 that would tend to move the distal end and the latching mechanism 46A of the card ejector in a direction away from face portion 26D of card 26A, but is unable to do so due to the retention force of the latching mechanism 46A being engaged with and latched to the face portion 26D of the card.

As further described herein, each of latching mechanisms 36A and 46A are releasably latched to the face portion 26D of card 26A when positioned in the latched positions illustrated by card ejector 30A and 40A, respectively. When card ejector 30A is in the latched position, the latching mechanism 36A may be intentionally actuated, for example by a human operator, to unlatch latching mechanism 36A from the front portion 26D. In various examples as further described herein, latching mechanism 36A is configured to be rotated to allow release of the latching mechanism from the front portion 26D. When latching mechanism 36A is actuated so as to be released from front portion 26D, the tensional force illustrated by arrow 70 moves the distal end of card ejector 30A and latching mechanism 36A in a direction indicted by arrow 72, and may move to an unlatched position illustrated by card ejector 30B in FIG. 2, due to the tensional force 70. At some position, such as the position illustrated by card ejector 30B, the tensional force 70 is relieved, and the card ejector stops moving away from face portion 26D due to the previously existing tensional force. At this point, case 26B and area 26C of card 26A may not have moved in the direction indicted by arrowhead 64, wherein area 26C of card 26A may remain fully or partially engaged with socket 16. If a rotational force in a direction illustrated by arrow 72 is applied to the card ejector 30B, the rotational force will be transmitted to cam 38 and to the upper cam engagement block 22. Because upper cam engagement block 22 is rigidly mounted to card cage 12, the force illustrated by arrow 72 is transmitted to upper cam engagement block 22 and will provide leverage to pull card 26A in the direction indicated by arrowhead 64, wherein the leverage afforded through the longitudinal axis of the card ejector provides a mechanical advantage for overcoming the force required to extract area 26C of card 26A from card socket 16. The rotational force 72 required to move card 26A in the direction of arrowhead 64 in some examples is provided by a human operator. In addition, a space 74 is provided between the distal end of card ejector 30B and face portion 26D by the tensional force 70 being relieved when latching mechanism 36A is released from the face portion 26D. Space 74 in some examples is configured to be large enough to allow a human operator to access space 74, for example using one or more fingers, and thus to provide access to allow application of the rotational force (illustrated by arrow 72) to a backside edge (edge facing the front portion 26D) to extract card 26A from card socket 16.

Similarly, when card ejector 40A is in the latched position, the latching mechanism 46A is operable to be actuated, for example by a human operator, to unlatch latching mechanism 46A from the front portion 26D. In various examples as further described herein, latching mechanism 46A is configured to be rotated to allow release of the latching mechanism 46A from the front portion 26D. When latching mechanism 46A is actuated so as to be released, the tensional force illustrated by arrow 80 moves the distal end of card ejector 40A and the latching mechanism 46A in a direction indicted by arrow 82, and may move to an unlatched position illustrated by ejector 40B in FIG. 2, due to the tensional force 80. At some position, such as the position illustrated by card ejector 40B, the tensional force is relieved, and the card ejector stops moving away from face portion 26D due to the previously existing tensional force 80. At this point, case 26B and areas 26C of card 26A may not have moved in the direction indicted by arrowhead 64, wherein area 26C of card 26A may remain fully or partially engaged with socket 16. If a rotational force in a direction illustrated by arrow 82 is applied to the card ejector 40B, the rotational force 82 will be transmitted to cam 48 and to the lower cam engagement block 24. Because lower cam engagement block 24 is rigidly mounted to card cage 12, the force transmitted to lower cam engagement block 24 will provide leverage to pull card 26A in the direction indicated by arrowhead 64, wherein the leverage afforded through the longitudinal axis of the card ejector provides a mechanical advantage for overcoming the force required to extract area 26C of card 26A from card socket 16. The rotational force illustrated by arrow 82, in some examples, is provided by a human operator. In addition, a space 84 is provided between the distal end of card ejector 40B and face portion 26D by movement of the card ejector when the tensional force 80 is relieved when latching mechanism 46A is released from the face portion 26D. Space 84 in some examples is configured to be large enough to allow a human operator to access space 84, in some examples using one or more fingers, and thus to provide access to allow application of the rotational force to a backside edge (edge facing the front portion 26D) of card ejector 40B to extract card 26A from card socket 16.

In various examples, and due at least in part to the rigidity of case 26B and the containment of card 26A in a slot of card cage 12, operation of either of card ejector 30A, B or card ejector 40A, B independently provides enough mechanical advantage to insert card 26A into card socket 16 without damaging card 26A or card socket 16 that could have otherwise occurred due to unwanted bending or twisting forces. In addition, as illustrated in FIG. 2, the extend and degree of rotation that can occur with respect to either of card ejectors 30A, B and 40A, B when moving these card ejectors in a direction toward the front portion 26D when inserting card 26A, is physically limited by the front portion 26D. For example, a total amount of rotation in a direction indicated by arrow 71 with respect to card ejector 30A, B is generally limited to the position shown for card ejector 30A, wherein the distal end and latching mechanism 36A of card ejector 30A, B is substantially adjacent to face portion 26D, which physically blocks further rotation of card ejector 30A, B in the direction of arrow 71. Similarly, a total amount of rotation in a direction indicated by arrow 81 with respect to card ejector 40A, B is generally limited to the position shown for card ejector 40A, wherein the distal end and latching mechanism 46A of card ejector 40A, B is substantially adjacent to face portion 26D, which physically blocks further rotation of card ejector 40A, B in the direction of arrow 81. This positive limit to the rotational movement of the card ejectors in a directions indicated by arrows 71 and 81 protects the card ejectors, the card 26A, and the card sockets 16 for experiencing forces provide to the card ejectors during the process of inserting card 26A into a slot and a card socket, which providing enough movement in this same rotational direction to allow card ejectors 30A, B and 40A, B to provide a mechanical advantage for properly and fully inserting card 26A into a card socket.

In addition, once card 26A is fully inserted into a slot and into a card socket, both latching mechanisms 36A and 46A provide a mechanism to secure the card ejectors 30A and 40A, respectively, and thus secure card 26A, within slot and prevent inadvertent and unintentional extraction or movement of the card away from the card socket. In various examples, and due at least in part to the rigidity of case 26B and the containment of card 26A in a slot of card cage 12, operation of either of card ejector 30A, B or card ejector 40A, B independently provide enough mechanical advantage to insert and/or to extract area 26C of card 26A to/from the card socket 16 without damaging card 26A or card socket 16 due to unwanted bending or twisting forces. In various examples, operation of both card ejectors in a substantially simultaneous matter is helpful and makes easier the insertion and extraction of card 26A into and from, respectively, a card socket. With respect to extraction of card 26 from card socket 16 and a card cage, once area 26C has been moved in the direction of arrowhead 64 to a position wherein area 26C no longer engages or is in contact with card socket 16, cams 38 and 48 may no longer be engaged with upper cam engagement block 22 and lower cam engagement block 24, respectively, and card 26A may be removed from the slot with the minimum force required to pull the card along the troughs or grooves of the slot, and without the needed assist of any rotational forces applied to the card ejectors. During this last part of the extraction process, one or both of card ejectors 30A, B and 40A, B may be used as "handles" to provide a place for an operator to grasp and pull card 26A the remaining distance out from the slot and the card cage to complete extraction the card.

Figure 3:
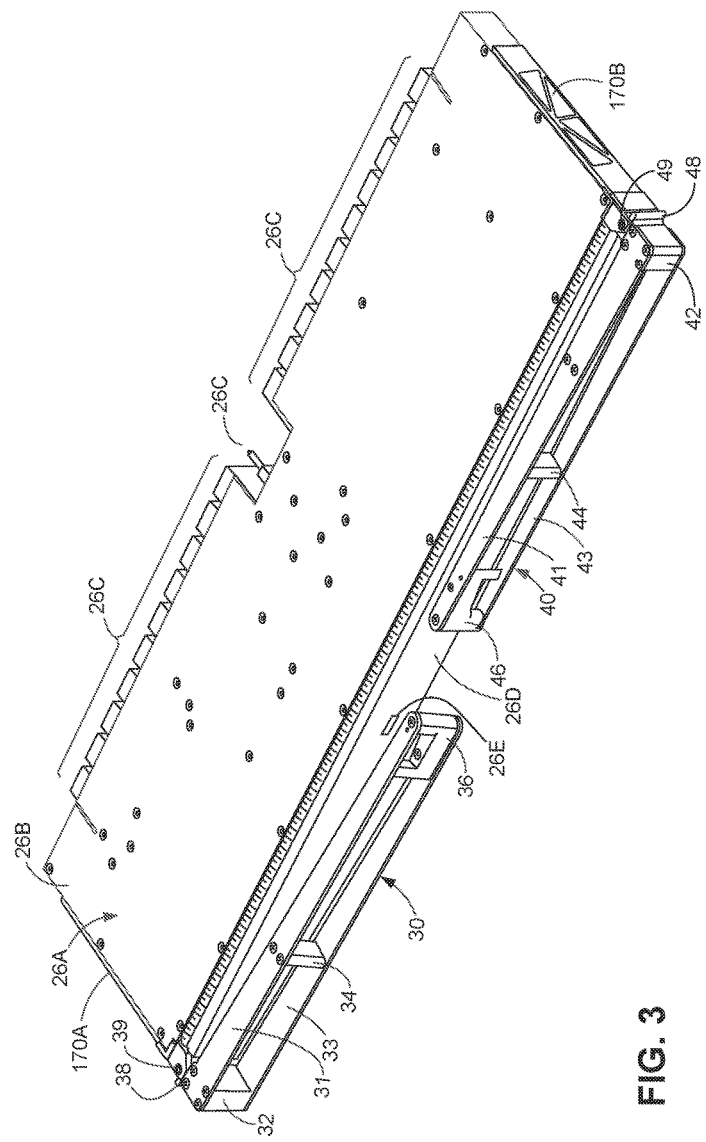
FIG. 3 is a perspective view illustrative of a card comprising card ejectors in accordance with one or more example implementations and techniques described in this disclosure.

FIG. 3 is a perspective view illustrative of a card 26A comprising card ejectors 30, 40 in accordance with one or more example implementations and techniques described in this disclosure. In various examples, card 26A as shown in FIG. 3 is any of cards 26 shown in FIG. 1, or is card 26A as illustrated in FIG. 2. As illustrated in FIG. 3, card 26A comprises a case 26B, a face portion 26D enclosing a front side of the card, and a plurality of electrical contracts located on an area 26C formed on a backside edge of card 26A opposite face portion 26D of the card. A first card ejector 30 is rotatably coupled to a siderail assembly 170A by a pin 39 at a top corner of face portion 26D. Siderail assembly 170A is fastened to a side of case 26B of card 26A, thus securing card ejector 30 to card 26A. Card ejector 30 comprises a pair of tapered lever arms 31, 33, that are coupled to opposite sides of cam block 32 at a proximal end of card ejector 30. Lever arm 31 is coupled to a first side of cam block 32, and lever arm 33 is coupled to a second side of cam block 32 that is opposite the first side of cam block 32. Cam block 32 comprises cam 38 that extends from cam block 32 and is configured to engage a cam engagement block (such as cam engagement block 22 shown in FIGS. 1 and 2). Lever arms 31 and 33 may be fastened to cam block 32 by various means, including but not limited to a plurality of fasteners, such a screws passing through holes in the lever arms into threaded holes in cam block 32. Lever arms 31 and 33 comprise sheets of material, for example metal, having a nominal thickness and a width at the proximal end that tapers along a longitudinal axis of the card ejector to a smaller width at a distal end of the card ejector. A latching mechanism 36 is rotatably coupled to the card ejector 30 and arranged between the lever arms 31, 33 at the distal end of the card ejector. In various examples, card ejector 30 comprises a spacer 34 located along the longitudinal axis of card ejector 30 between the proximal end and the distal end, and located between and fastened to each of lever arms 31, 33.

As shown in FIG. 3, card ejector 30 is positioned at an angle relative to a face portion 26D of card 26A, having the longitudinal axis forming an acute angle relative to face portion 26D, and the latching mechanism 36 in a position to engage an opening 26E of face portion 26D. When engaged with opening 26E, latching mechanism 36 is configured to provide an over-center latching arrangement, as further described herein, to secure latching mechanism 36 and card ejector 30 in place. When card ejector 30 is positioned as shown in FIG. 3, cam 38 is not fully extended to a position that cam 38 would assume when card 26A is fully inserted in a card cage (such as card cage 12 as shown in FIGS. 1 and 2) and cam 38 is engaged with a cam engagement block (such as cam engagement block 22 shown in FIGS. 1 and 2). As shown in FIG. 3 the electrical connectors along area 26C would not be in contact with or at least not fully inserted into a card socket (not shown in FIG. 3) associated with a slot that card 26A has been inserted into. In addition, because of the spacing created between lever arms 31 and 33, access to the face portion 26D that is adjacent to card ejector 30 is still made available when card ejector 30 is eventually fully engaged and latched with face portion 26D of card 26A.

As illustrated in FIG. 3, a second card ejector 40 is rotatably coupled to a siderail assembly 170B by a pin 49 at a bottom corner of face portion 26D. Siderail assembly 170B is fastened to a side of case 26B of card 26A opposite the side of case 26B used to secure siderail assembly 170A, and wherein siderail assembly 170B is configured to secure card ejector 40 to card 26A. Card ejector 40 comprises a pair of tapered lever arms 41, 43, that are coupled to opposite sides of cam block 42 at a proximal end of card ejector 40. Lever arm 41 is coupled to a first side of cam block 42, and lever arm 43 is coupled to a second side of cam block 42 that is opposite the first side of cam block 42. Cam block 42 comprises cam 48 that extends from cam block 42 and is configured to engage a cam engagement block (such as cam engagement block 24 shown in FIGS. 1 and 2). Lever arms 41 and 42 may be fastened to cam block 42 by various means, including but not limited to a plurality of fasteners, such a screws passing through holes in the lever arms into threaded holes in cam block 42. Lever arms 41 and 43 comprise sheets of material, for example metal, having a nominal thickness and a width at the proximal end that tapers along a longitudinal axis of the card ejector to a smaller width at a distal end of the card ejector. As described above, the taper of each lever arm allows a tension, as described above, when induced in the card ejector, to be uniformly distributed along the longitudinal axis of the lever arm, in contrast to a straight beam that does not distribute uniformly a load placed the straight beam. The taper of the lever arms described herein provides the card ejectors as disclosed herein with elastic behavior over a greater deformation range. In addition, the use of two tapered levers arms for each card ejector, as opposed to a single lever arm per card ejector, provides additional distribution of the forces applied to the card ejector when used to insert, to latch, and to extract a card from a card socket. A latching mechanism 46 is rotatably coupled to the card ejector 40 and arranged between the lever arms 41, 43 at the distal end of the card ejector. In addition, latching mechanism is configured to provide an over-center latching arrangement, as further described herein, to secure latching mechanism 46 and card ejector 40 in place. In various examples, card ejector 40 comprises a spacer 44 located along the longitudinal axis of card ejector 40 between the proximal end and the distal end, and located between and fastened to each of lever arms 41, 43.

As shown in FIG. 3, card ejector 40 is positioned substantially adjacent to a face portion 26D of card 26A, having the longitudinal axis substantially parallel to face portion 26D, and the latching mechanism 46 in a position to engage an opening (not shown in FIG. 3) of face portion 26D. When card ejector 40 is positioned as shown in FIG. 3, cam 48 is fully extended to a position that cam 48 would assume when card 26A is fully inserted in a card cage (such as card cage 12 as shown in FIGS. 1 and 2) and cam 48 is engaged with a cam engagement block (such as cam engagement block 24 shown in FIGS. 1 and 2). As shown in FIG. 3, when card ejector 40 is in the latched position when card 26A is fully inserted into a card slot, the electrical connectors shown along area 26C would be fully inserted into a card socket (not shown in FIG. 3) associated with a slot that card 26A has been inserted into. In addition, because of the spacing created between lever arms 41 and 43, access to the face portion 26D that is adjacent to card ejector 40 is still made available when card ejector 40 is in the position illustrated in FIG. 3.

Figure 4A:
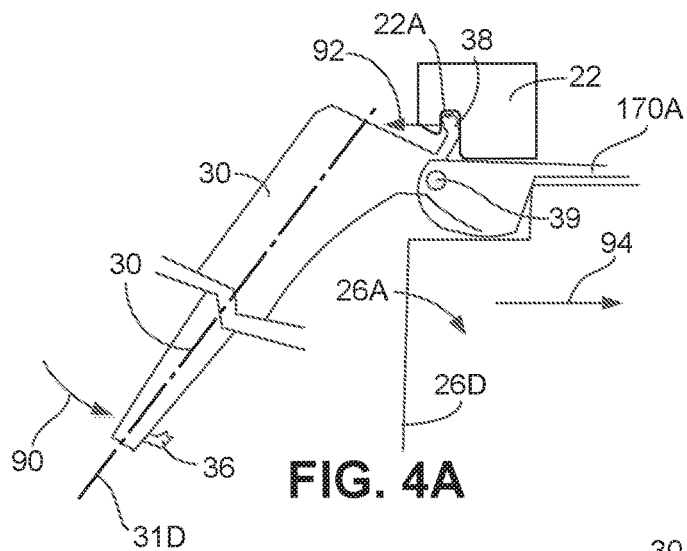
FIG. 4A-C are side views illustrative of various positions of a latching mechanism relative to an engagement block in accordance with one or more example implementations and techniques described in this disclosure.
Figure 4B:
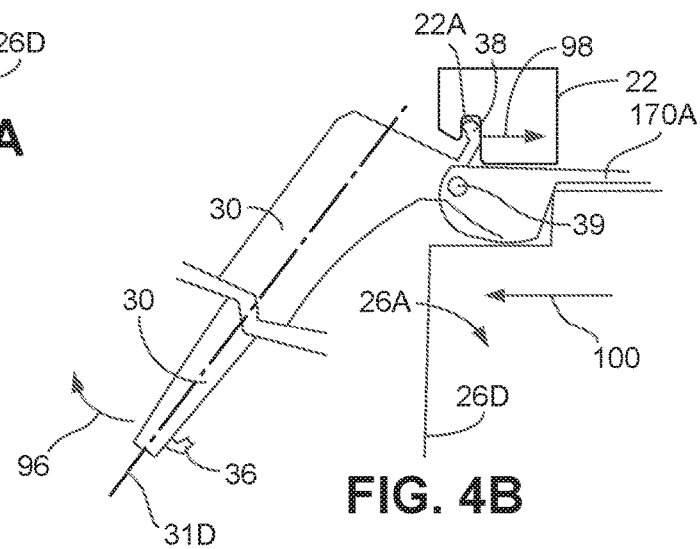
Figure 4C:
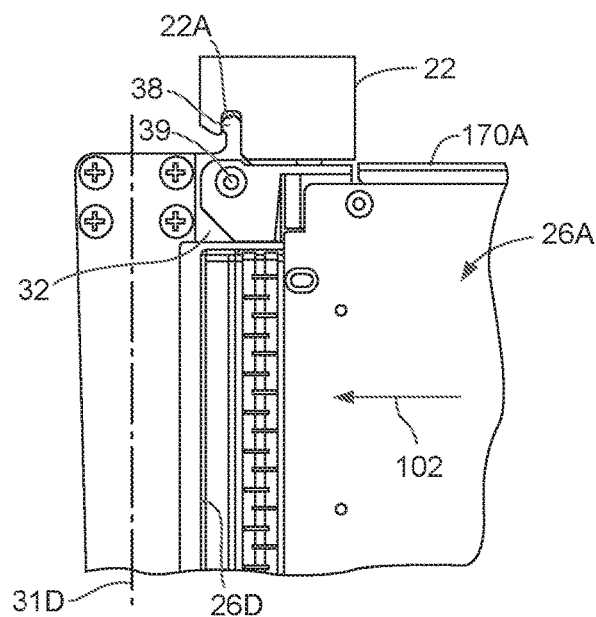

FIGS. 4A-C are side views illustrative of various positions of card ejector 30 relative to a cam engagement block 22 in accordance with one or more example implementations and techniques described in this disclosure. As illustrated in FIG. 4A, the card ejector 30 is rotatably coupled to card 26A through pin 39 and siderail assembly 170A. Card ejector 30 is positioned so that a longitudinal axis 31D of the card ejector 30 is at an angle relative to face portion 26D of card 26A. Cam 38 of the card ejector 30 is engaged with and partially within a trough 22A of cam engagement block 22. A force in a direction illustrated by arrow 90 is shown as being applied to card ejector 30 so as to urge the distal end of card ejector 30 and the latching mechanism 36 in a direction toward the face portion 26D of card 26A. As a result of a force illustrated by arrow 90, a rotational force is generated around pin 39 and is transmitted through card ejector 30 to cam 38, wherein cam 38 transfers the rotational force to a force applied against a surface within trough 22A of the cam engagement block 22 in a direction illustrated by arrow 92. Because the cam engagement block 22 is mounted so as to be stationary relative to a card cage (not shown in FIG. 4A, but e.g., card cage 12 shown in FIGS. 1 and 2), the force exerted on cam engagement block 22 illustrated by arrow 92 results in computer card 26 being urged in a direction illustrated by arrow 94. As described for examples with respect to FIG. 2, movement of the card 26A in a direction illustrated by arrow 94, when card 26A is positioned in a slot of a card cage associated with cam engagement block 22, moves the computer card 26A in the direction of a card socket (not shown in FIG. 4A, but e.g., the card socket 16 shown in FIGS. 1 and 2).

Further, because the force illustrated by arrow 90 can be exerted at or near the distal end of the card ejector 30 relative to the rotational point provided by pin 39, card ejector 30 acts as a lever to provide a mechanical advantage, creating a force in the direction of arrow 94 to aid in generating the force required to be applied to the card 26A in order to fully insert card 26A into a card socket, or a plurality of card sockets. In various examples, the force illustrated by arrow 90 may be applied to card ejector 30 by a human operator when card 26A has been positioned in a slot in a card cage and card 26A needs to be fully inserted and/or secured into a card socket associated with that slot.

As illustrated in FIG. 4B, and in a similar manner as illustrated and described above with respect to FIG. 4A, the card ejector 30 in FIG. 4B is rotatably coupled to card 26A through pin 39 and siderail assembly 170A. Card ejector 30 is positioned so that a longitudinal axis 31D of the card ejector 30 is at an angle relative to face portion 26D of card 26A. Cam 38 of the card ejector 30 is engaged with and partially within the trough 22A of cam engagement block 22. In contrast to FIG. 4A and as illustrated in FIG. 4B, a force in a direction illustrated by arrow 96 is shown as being applied to card ejector 30 so as to urge the distal end of card ejector 30 and the latching mechanism 36 in a direction away from the face portion 26D of card 26A. As a result of a force illustrated by arrow 96, a rotational force around pin 39 is generated and is transmitted through card ejector 30 to cam 38, wherein cam 38 transfers the rotational force to a force provided against a surface within the trough 22A of the cam engagement block 22 in a direction illustrated by arrow 98. Because cam engagement block 22 is mounted so as to be stationary relative to a card cage (not shown in FIG. 4B, but e.g., card cage 12 shown in FIGS. 1 and 2), the force exerted on cam engagement block 22 illustrated by arrow 98 results in card 26A being urged in a direction illustrated by arrow 100. As described for examples with respect to FIG. 2, movement of the card 26A in a direction illustrated by arrow 100 when card 26A is positioned in a slot of a card cage associated with cam engagement block 22 moves the computer card 26A in a direction to extract the card from a card socket, or a plurality of card sockets (not shown in FIG. 4B, but e.g., the card socket 16 shown in FIGS. 1 and 2).

Further, because the rotational force illustrated by arrow 96 can be exerted at or near the distal end of the card ejector 30 relative to the rotational point provided by pin 39, card ejector 30 acts a lever to provide a mechanical advantage, creating a force in the direction of arrow 100 to aid in generating the force required to be applied to the card 26A in order to move card 26A in the direction of arrow 100, including moving the card 26 in the direction illustrated by arrow 100 while overcoming the resistive force required to extract card 26A from a card socket. In various examples, the rotational force illustrated by arrow 96 may be applied to card ejector 30 by a human operator in order to extract the card 26A from a card socket at least to the position wherein card 26A no longer engages with or is in contact with the card socket that card 26A is being extracted from.

FIG. 4C illustrates a partial view of the card ejector 30 including the proximal end of the card ejector in a position adjacent to card 26A. As illustrated, card ejector 30 is in a latched position (similar to a position of card ejector 30A as shown in FIG. 2), and oriented such that the longitudinal axis 31D of the card ejector is substantially parallel to the face portion 26D of card 26A. As shown in FIG. 4C, when card ejector 30 is in this latched position, cam 38 remains engaged with and is partially enclosed within trough 22A of the cam engagement block 22. Because cam engagement block 22 is rigidly mounted relative to a card cage (not shown in FIG. 4C), card 26A is secured in a slot into which card 26A has been installed. When card ejector 30 is in this position, cam 38 prevents card 26A from moving in the direction illustrated by arrow 102.

In addition, because card ejector 30 is adjacent to face portion 26D of card 26A along the backside edge (edge closest to face portion 26D) of card ejector 30, any additional force applied to card ejector 30 in the direction of face portion 26D (illustrated by arrow 90 in FIG. 4A) will not result in significant further movement of card ejector 30 in a direction toward face portion 26D. This feature limits the amount of movement of card 26A that can occur in the direction of arrow 94 by limiting the rotational range of card ejector 30 relative to rotational point provided by pin 39 and card 26A. As described above, this limit on the range of rotation of card ejector 30 in the direction of face portion 26D prevents computer card 26A from being forced too deeply into the computer socket associated with the slot into which computer card 26A is inserted, limits elastic deformation of lever arms 31 and 33, and prevents exertion of too much force (e.g., over-insertion) by card ejector 30 when using card ejector 30 to insert card 26A.

Figure 8:
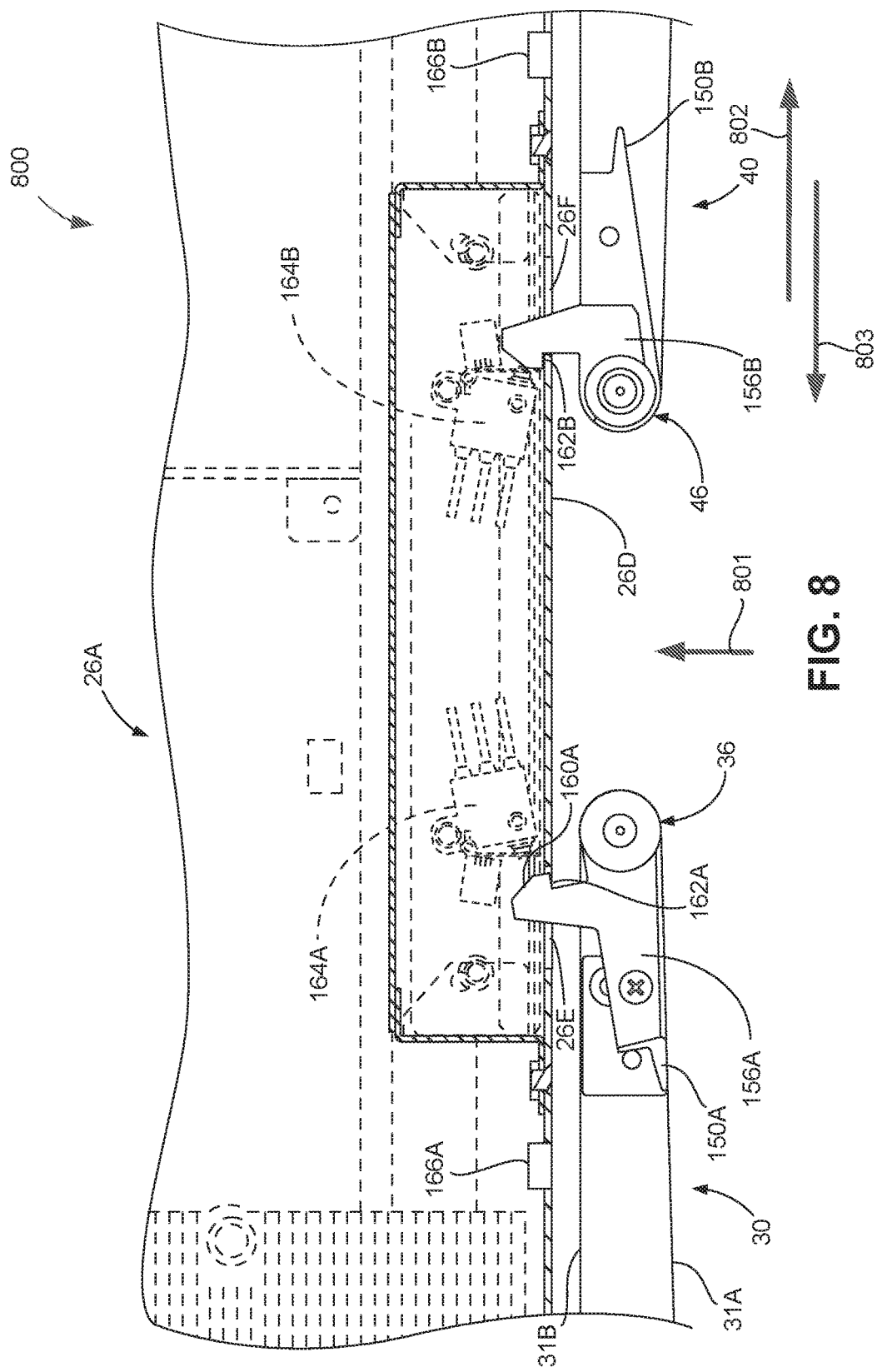
FIG. 8 is a partial view illustrative of a pair of card ejectors at various stages of engagement with a face portion of a card in accordance with one or more example implementations and techniques described in this disclosure.

As described above and as illustrated and described in more detail with respect to FIG. 8, card ejector 30 includes a latching mechanism that is configured to engage and to latch the card ejector 30 so that card ejector 30 is maintained in the position as shown in FIG. 4C. When card ejector is maintained in the position as illustrated in FIG. 4C, card 26A in conjunction with cam 38 being engaged with cam engagement block 22, is secured against unintended and/or inadvertent movement of card 26A in the direction indicated by arrow 100. In addition, when card ejector is in the latched position illustrated by FIG. 4C, the position of cam 38 and pin 39 relative to siderail 170A provide a "over-center" latch arrangement. When providing the over-latch arrangement, any back force exerted on card 26A (represented by a force in the direction of arrow 102), would be directed to cam engagement block 22 through siderail 170A in a direction that would tend to rotate card ejector 30 in the direction indicated by arrow 96, and to urge cam 38 to exert a force illustrated by arrow 98 in FIG. 4B. However, the over-center latch arrangement of latching mechanism 36, when in the latched position relative to the face portion 26D of card 26A, provides security for card ejector 30 against the card ejector being inadvertently unlatched due to back forces that may be imposed on card 26A. The distal end of the card ejector 30 when in the latched position provided by the over-center latching mechanism is configured to hold lever arms of card ejector 30 in tension, while rotating the latch hook of latching mechanism 36 into a locking position, thus preventing an inadvertent unlatching of card ejector 30 from card 26A.

Figure 5A:
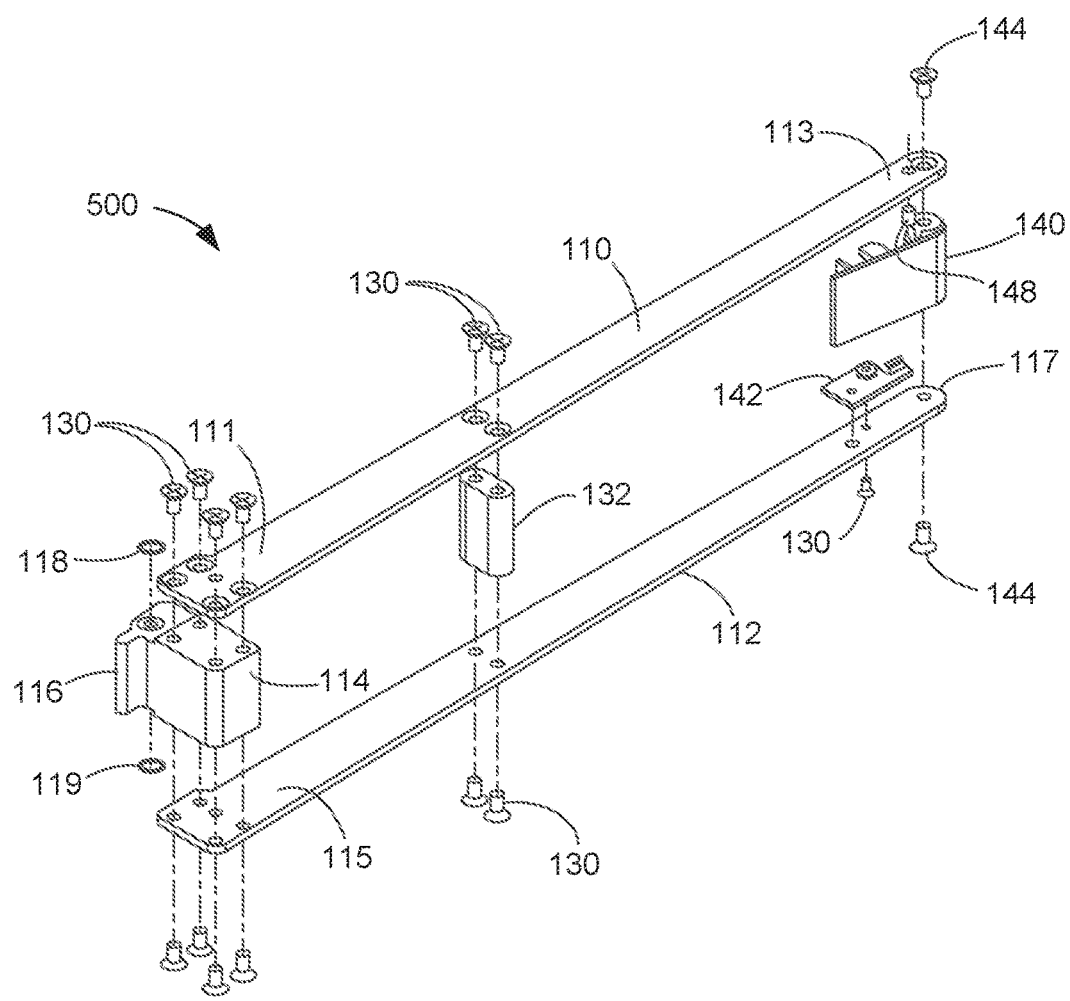
FIG. 5A is an exploded view illustrative of a card ejector in accordance with one or more example implementations and techniques described in this disclosure.

FIG. 5A is an exploded view illustrative of a card ejector 500 in accordance with one or more example implementations and techniques described in this disclosure. In various examples, card ejector 500 is illustrative of any of card ejectors 30, 30A, 30B, 40, 40A, 40B shown in any of FIGS. 1, 2, 3, and 4A-C. As illustrated in FIG. 5A, card ejector 500 includes a first lever arm 110 and a second lever arm 112, a cam block 114, a latching mechanism 140, and a spacer 132. As illustrated, lever arm 110 comprises a sheet of material, in some examples a sheet of metal, having a nominal thickness, a proximal end 111, and a distal end 113, and having a width dimension at the proximal end 111 that tapers to a smaller width dimension at the distal end 113. Lever arm 112 also comprises a sheet of material, in some examples a sheet of metal, having a nominal thickness, a proximal end 115, and a distal end 117, and having a width dimension at the proximal end 115 that tapers to a smaller width dimension at the distal end 117 of approximately half width of proximal end 115. Lever arm 110 is configured to be fastened by fasteners 130 to a first side of cam block 114, and lever arm 112 is configured to be fastened by additional fasteners 130 to a side of cam block 114 opposite the first side of cam block 114. A thickness dimension of cam block 114 between the first side and the second side provides a spacing between lever arm 110 and 112 when the lever arms are fastened to cam block 114. Cam block 114 also comprises cam 116, wherein cam block 114 and cam 116 are configured to engage cam engagement blocks mounted within card cages and to exert forces on these cam engagement blocks to assist in the insertion and the extraction of cards to which card ejector 500 is configured to be rotatably attached to, as described herein.

A spacer 132 is operable to be coupled, using additional fasteners 130, to and between lever arms 110 and 112 at a position between the proximal and distal ends of the lever arms. Spacer 132 is configured to provide additional mechanical support and strength for the coupling together of lever arms 110 and 112, while still allowing for spaces between the lever arms. As described above, these spaces between lever arms 110 and 112 allow for access between the lever arms for the purpose of making electrical and physical connections through these spaces to the face portion (such as face portion 26D of card 26A as described herein), and to allow visual access to such components as indicator light or other display devices that may be located on a face portion of a card when card ejector 500 is rotatably coupled to and is securing that card in a slot of a card cage.

Latching mechanism 140 is rotatably coupled to each of and between lever arms 110 and 112 by fasteners 144. Latching mechanism 140 includes a latch (see e.g., hook 156 shown in FIGS. 6A-6E) and is configured to engage and to releasably latch with an opening in a face portion of a card (not shown in FIG. 5A) to which card ejector 500 is configured to be coupled to. In various examples, retainer clip 142 is configured to be fastened to lever arm 112 (or in other examples to level arm 110) by fastener 130 and is configured to provide a spring retention function for a latching torsion spring used to rotate the latching mechanism into a latching position. Pin 148, integral to lever arm 110, provides a set of physical travel limits associated with the degree of rotation allowed for latching mechanism 140 relative to the rotational point provided by fasteners 144. In various examples, pin 148 is a dowel pin. In various examples, pin 148 comprises a cylindrical shape having a diameter of 0.12 inches perpendicular to a longitudinal axis of the pin, and a length (height) of 0.25 inches. Pin 148 is further described below and illustrated and/or described with respect to FIG. 6D and FIG. 6E.

Figure 5B:
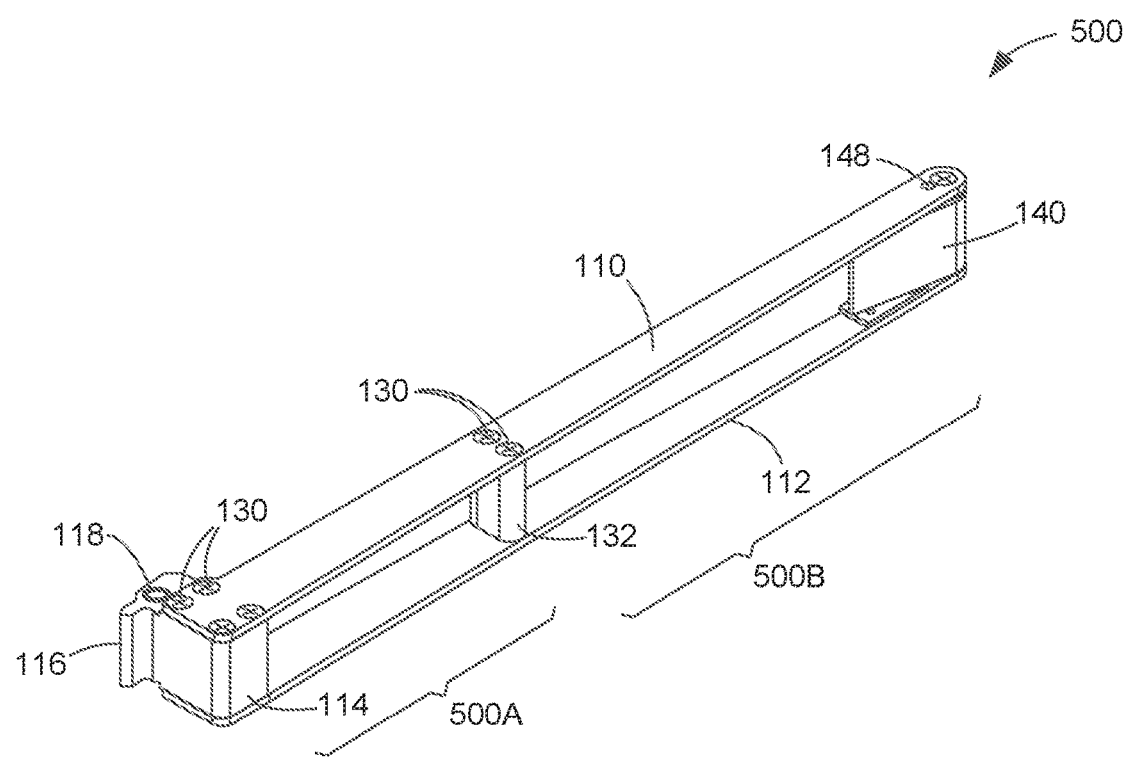
FIG. 5B is an assembled view illustrative of a card ejector illustrated in FIG. 5A and in accordance with one or more example implementations and techniques described in this disclosure.

FIG. 5B is an assembled view illustrative of the card ejector 500 illustrated in FIG. 5A and in accordance with one or more example implementations and techniques described in this disclosure. As illustrated in FIG. 5B, lever arms 110 and 112 are coupled at the proximal ends to cam block 114, are rotatably coupled at the distal ends of the lever arms 110, 112 to latching mechanism 140. Lever arms 110, 112 are also coupled at a point between the proximal ends and the distal ends by spacer 132. When assembled as shown in FIG. 5B, card ejector 500 includes a first space 500A between lever arms 110, 112, cam block 114, and spacer 132, and a second space 500B between lever arms 110, 112, spacer 132, and latching mechanism 140. As discussed above, spaces 500A and 500B provide access to a face portion of a card when card ejector 500 is in a latched position and is securing a card in a card cage, as discussed for example with respect to card ejectors 30, 30A, 30B, 40, 40A, and 40B in FIG. 1, FIG. 2, and FIG. 3. Pin 148 is also illustrated in FIG. 5A and FIG. 5C2 as being fixedly mountable to lever arm 110.

FIGS. 5C1-C4 include directional views illustrative of card ejector 500 in accordance with one or more example implementations and techniques described in this disclosure. FIG. 5C1 illustrates a front view of card ejector 500 including a pair of lever arms 110, 112 coupled at a proximal end of card ejector 500 by cam block 114, and rotatably coupled to latching mechanism 140. As illustrated in FIG. 5C1, card ejector 500 includes a spacer 132 coupled between lever arm 110, 112, dividing the area between lever arms 110 and 112 into space 500A and space 500B. In various examples, card ejector 500 has a length dimension 202 along a longitudinal axis of lever of 110, 112, and an overall height dimension 204. In various examples, a value for length dimension 202 is 13.97 inches, and a value for the overall height dimension 204 is 1.51 inches.

FIG. 5C2 illustrates a top view of card ejector 500 including a pair of lever arms 110, 112 coupled at a proximal end of card ejector 500 by cam block 114, and rotatably coupled to latching mechanism 140, wherein latching mechanism 140 is contained in an area between lever arm 110 and lever arm 112 except for hook 156, which extends beyond the area between the lever arms. A distance dimension between a rotational point for the latching mechanism 140 and a corner edge of a top surface of the hook 156 has a dimension 210. In various examples, a value for width dimension 210 is 0.1 inches, and a value for width dimension 214 is 0.57 inches. Each of lever arms 110 and 112 have a width dimension 212 near a proximal end of the lever arms, a substantially straight edge 113A, and a tapered edge 111A configured to form a width dimension 214 at the distal end of each arm. In various examples, a value for width dimension 212 is 1.00 inches, and a value for width dimension 214 is 0.57 inches.

As illustrated in FIG. 5C2, card ejector 500 includes a pin 118 located in a portion of cam block 114 that extends outside of the area included between lever arm 110 and lever arm 112. In addition, cam 116 extends from cam block 114 in an area of cam block 114 outside the area included between lever arm 110 and lever arm 112. In various examples, cam 116 has a rounded end having a diameter dimension 218. In various examples, diameter dimension 218 is 0.18 inches. A distance from the center of pin 118 to the outside edge of the rounded end of cam 116 has a dimension 208. In various examples, a value for dimension 208 is 0.55 inches. Card ejector 500 has a length dimension 206 along a longitudinal axis of lever of 110, 112, extending from a center point of pin 118 to a center for a point of rotation for the card ejector. In various examples, a value for a length dimension 206 is 13.97 inches. In various examples, the dimensions of card ejector 500 provide a 25:1 mechanical advantage allows card ejector 500 to easily insert a card against a matting connector insertion resistance of 350 lbs. The values for the dimensions provided in FIGS. 5C1 and 5C2 are examples of dimensions for a card ejector, wherein variations of these dimensions and/or proportions of these dimensions relative to one and other, including card ejectors having different overall length dimensions, are contemplated by the card ejectors disclosed herein.

FIG. 5C3 illustrates an end view of card ejector 500 shown from the distal end of the card ejector, including the pair of lever arms 110, 112 coupled at a distal end of card ejector by latching mechanism 140. FIG. 5C4 illustrates an end view of card ejector 500 shown from the proximal end of the card ejector, including the pair of lever arms 110, 112 coupled at the proximal end of card ejector by cam block 114, and comprising cam 116 extending from cam block 114 and outside the area between lever arms 110 and 112.

FIG. 6A is an exploded view illustrative of a latching mechanism 140 in accordance with one or more example implementations and techniques described in this disclosure. As illustrated, latching mechanism includes a latching body 154, a latching spring 152, a latch release lever 150, and a hook 156. Latching body 154 mechanically retains one lead of latching spring 152, wherein the second lead of latching spring 152 may be mechanically retained by a spring retaining clip (such as retaining clip 142 shown in FIG. 5A) that is mounted to one of the lever arms to which latching mechanism 140 is configured to be rotatably coupled to. Hook 156 and latch release lever 150 are configured to be mounted in a fixed position to latching body 154 by one or more fasteners 130. A rod 158 with threaded holes at each end is configured to be insertably coupled to the latching body 154 to provide a mechanism to rotatably fasten latching mechanism 140 to a pair of lever arms (e.g., lever arms 110 and 112 shown in FIGS. 5A-B), and allow the latching body 154, the hook 156, and the latch release lever 150 to rotate over some rotational distance (degrees of rotation) around rod 158.

FIG. 6B is an assembled view illustrative the latching mechanism 140 in accordance with one or more example implementations and techniques described in this disclosure. As illustrated, latching mechanism 140 comprises the hook 156 and the latch release lever 150 attached to latching body 154 in a rigid and fixed position relative to the latching body 154. A first lead of latching spring 152 is mechanically retained within the latching body 154 and the latch release lever 150, and the second lead of latching spring 152 extends above the latch release lever 150. When coupled to a pair of lever arms of a card ejector, latching spring 152 is configured to exert a spring force between the lever arms and the latching body 154 to cause the latching mechanism 140 to rotate about rod 158 and to drive hook 156 to a latching position, and the latch release lever 150 further configured to allow an operator, such as a human operator, to actuate the latching mechanism 140 and rotate the latching mechanism 140 against the force being exerted by the latching spring 152 to thereby rotate the latching mechanism 140 and the hook 156 to a release position, as will be further illustrated below with respect to FIG. 8.

In various examples, latching mechanism 140 comprises a groove 157 that surrounds a portion of the latching body 154, and is configured to engage a post of a pin fixed to one of the lever arms to which latching mechanism 140 is configured to be rotatably coupled. A pin (not shown in FIG. 6B) is stationary relative to the lever arm, and the groove 157 within the latching body 154 is configured to move relative to the pin as the latching mechanism 140 is rotated. The groove does not extend around the entire circumference of the latching body 154, and includes a set of endpoints at each end of the groove. The pin engages the groove and is configured to travel along the groove, between the set of endpoints, as the latching mechanism is rotated. The endpoints provide limits to the travel of the latching body relative to the position of the pin, and thus mechanically limit the total amount (e.g., degrees) of rotation of the latching body around rod 158. Each endpoint of groove 157 also provides a rotational stopping position for the latching mechanism in each direction, respectively, of rotation available for the latching mechanism. The endpoints of the groove are positioned so that when the pin engages the groove, an amount of rotation in a first direction of the latching mechanism is configured so that the latching mechanism can properly engage and latch an opening in the face portion of a card, and an amount of rotation in a second and opposite direction of the latching mechanism is configured so that the latching mechanism, once latched to an opening in the face portion of a card, can be unlatched from and extracted from the opening in the face portion of the card. The amount of latching mechanism rotation in the second direction limits spring 152 deformation to be within an elastic range and prevents plastic deformation of spring 152. The pin, the endpoints, and groove 157 are further described below and illustrated with respect to FIG. 6D and FIG. 6E.

FIG. 6C is a perspective view illustrative of the hook 156 of the latching mechanism 140 in accordance with one or more example implementations and techniques described in this disclosure. As illustrated in FIG. 6C, hook 156 includes a hook portion 164 that extends from the latching mechanism, and when the latching mechanism is coupled to the lever arms of a card ejector, is configured to extend beyond the inside edge of the card ejector and the lever arms to engage an opening in a face portion of a card when the distal end of the card ejector is brought into proximity with the opening. Engagement surfaces 160 are angled so that a top of the hook portion 164 of hook 156 is narrower than a portion of the hook 156 that includes a latching surface 162. Hook 156 is arranged relative to the opening in a face portion of a card so that as the distal portion of the card ejector is brought into proximity with the opening in the face portion of the card, engagement surfaces 160 contact an edge of the opening and rotate latch body 154, allowing hook 156 to have hook portion 164 enter and pass through the opening. Once hook portion 164 has passed through the opening to the point that engagement surface 162 clears the inside edge of the opening, latching spring 152 is configured to move hook 156 to the latching position, wherein engagement surface 162 extends to an inside surface of face portion of the card, and thus prevents the hook portion 164 of hook 156 from exiting back out from the opening, and thus securing the latching mechanism, and the card ejector coupled to the latching mechanism, to the face portion of the card.

Figure 6D:
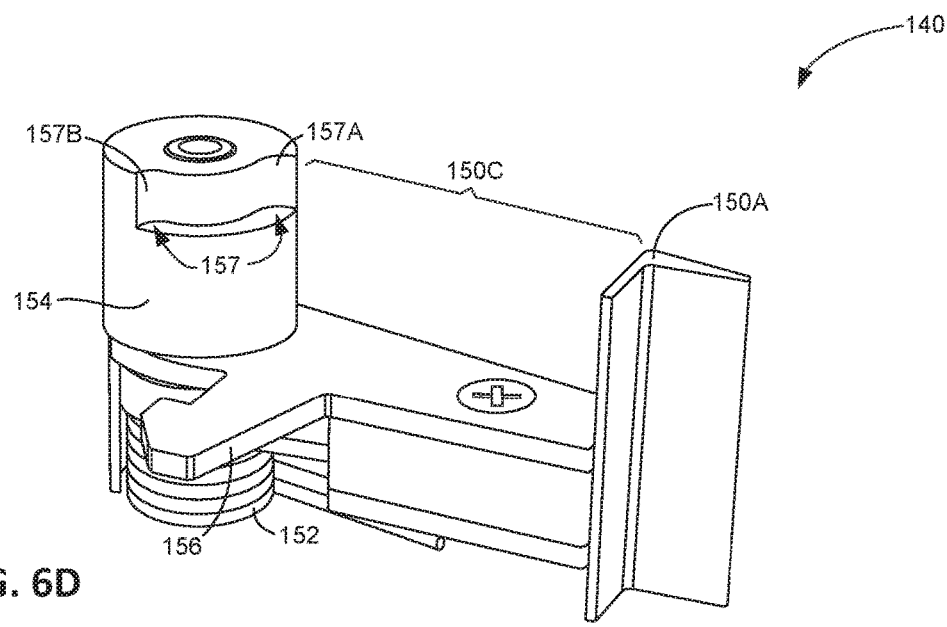
FIG. 6D is a perceptive view illustrating the latching mechanism in accordance with one or more example implementations and techniques described in this disclosure.
Figure 6E:
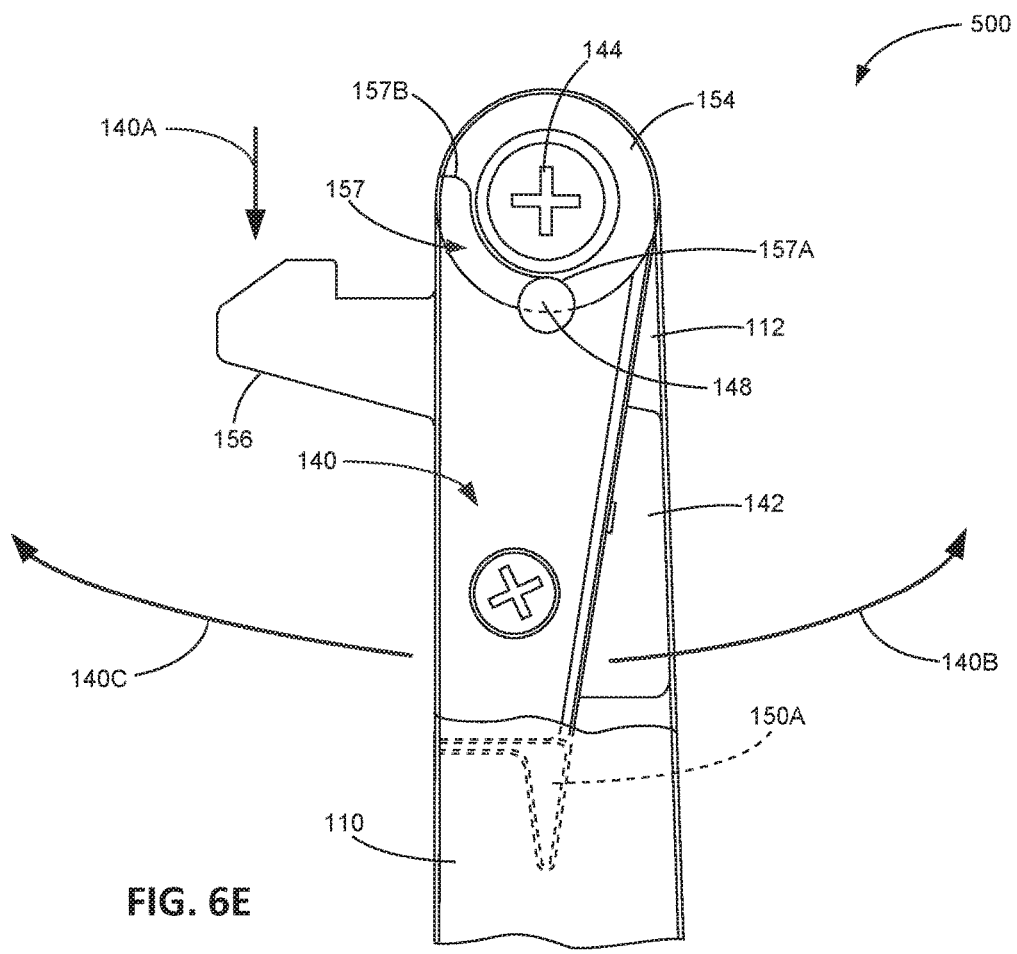
FIG. 6E is a top view illustrating the latching mechanism mounted to a distal end of a card ejector in accordance with one or more example implementations and techniques described in this disclosure.

FIG. 6D is a perceptive view illustrating the latching mechanism 140 in accordance with one or more example implementations and techniques described in this disclosure. As illustrated, latching mechanism 140 comprises latching body 154, hook 156 coupled to latching body 154, latch release lever 150A, and latching torsional spring 152. A shown in FIG. 6D, and in contrast to latch release lever 150 shown in FIG. 6A, latch release lever 150A includes a cutaway area 150C. However, latch release lever 150A may be used in any of the examples described or illustrated herein that utilize latching mechanism 140. Latching body 154 further comprises groove 157 including a first endpoint 157A at a first end of groove 157, and a second endpoint 157B at a second end of groove 157. As described above and as further illustrated below with respect to FIG. 6E, groove 157 is configured to engage a pin (e.g., pin 148 as shown in FIGS. 5A and 6E) and to allow travel of the pin through the groove between first endpoint 157A and second endpoint 157B as latching mechanism 140 is rotated. The endpoints 157A and 157B physically limit a range of rotational travel for latching mechanism 140 about a point of rotation when latching mechanism 140 is rotatably fastened to a pair of lever arms (not shown in FIG. 6D).

FIG. 6E is a top view illustrating the latching mechanism 140 mounted to a distal end of a card ejector 500 in accordance with one or more example implementations and techniques described in this disclosure. Latching mechanism 140, including latch release lever 150A, latch body 154, and hook 156, is rotatably fastened to the distal end of lever arm 110 of card ejector 500, for example by fastener 144. Pin 148 is fixedly mounted to lever arm 110 and extends below lever arm 110 to engage groove 157 of latch body 154. As illustrated, pin 148 is in contact with or is proximate to the first endpoint 157A of groove 157. As such, pin 148 and the first endpoint 157A of groove 157 physically limits further rotation of latching mechanism 140 in the direction indicated by arrow 140C. The direction of rotation of latching mechanism 140 indicated by arrow 140C is the direction of rotation that the latching spring 152, as illustrated in FIG. 6D, would rotate latching mechanism 140 in when other forces, as illustrated by arrow 140A and 140B, are not being applied to the latching mechanism 140. Engagement of pin 148 with first endpoint 157A physically limits the further rotation of latching mechanism 140 in the direction indicated by arrow 140C once pin 148 is in contact with endpoint 157A. In various examples, the position of pin 148 in contact with or proximate to the first endpoint 157A is the position latch body 154 and hook 156 would assume when the card ejector is in fully engaged and latched to a face portion of a card (not shown in FIG. 6E).

Lever release mechanism 150A is configured to be actuated in a direction indicated by arrow 140B, in order to rotate latching mechanism 140 around fastener 144 in the direction indicated by arrow 140B. In various examples, this actuation of latching mechanism 140 is performed by an operator, such as a human operator, in the process on unlatching card ejector 500 from a face portion of a card (operator and face portion of a card not shown in FIG. 6E). When the latching mechanism 140 is actuated so as to rotate in a direction indicated by arrow 140B, the latching body 154 is rotated so that groove 157 move relative to pin 148, causing endpoint 157A to move away from pin 148 as groove 157 travels past pin 148, and causing second endpoint 157B to move closer to pin 148. If latching mechanism 140 of rotated to the extent that endpoint 157B is brought into contact with pin 148, endpoint 157B provides a travel limit that prevents further rotation of latching mechanism 140 in the direction indicated by arrow 140B, and thus limits the rotation of latching mechanism 140 in the direction indicated by arrow 140B. In various examples, the extent of rotation allowed by having pin 148 travel from a position of being in contact with first endpoint 157A to a position of being in contact with endpoint 157B or proximate to second endpoint 157B of groove 157 is an amount of rotation that is adequate to allow for unlatching of hook 156 for an opening and a face portion of a card (not shown in FIG. 6E).

In addition, when the latching mechanism 140 and card ejector 500 are being latched to an opening of a face portion of a card, as further described below with respect to FIG. 8, a force illustrated by arrow 140A may be applied to hook 156. When a force illustrated by arrow 140A is applied to hook 156, latching mechanism 140 may be rotated in a direction indicated by arrow 140B. As noted above, the amount of rotation allowed for latching mechanism 140 in the direction indicated by arrow 140B is again limited by the extent of travel of provided by groove 157 and endpoint 157B. In various examples, when no external forces, such as forces illustrated by arrow 140A, or forces actuating lever release mechanism 150A in the direction indicated by arrow 140B are being applied to the latching mechanism, the latching spring 152 is configured to urge rotation of the latching mechanism in the direction indicated by arrow 140C. The direction of rotation brings and/or maintains pin 148 to be in contact with and proximate to endpoint 157A of groove 157, when the card ejector 500 is in the latched position having hook 156 fully engaged and latched to a face portion of a card.

Figure 7:
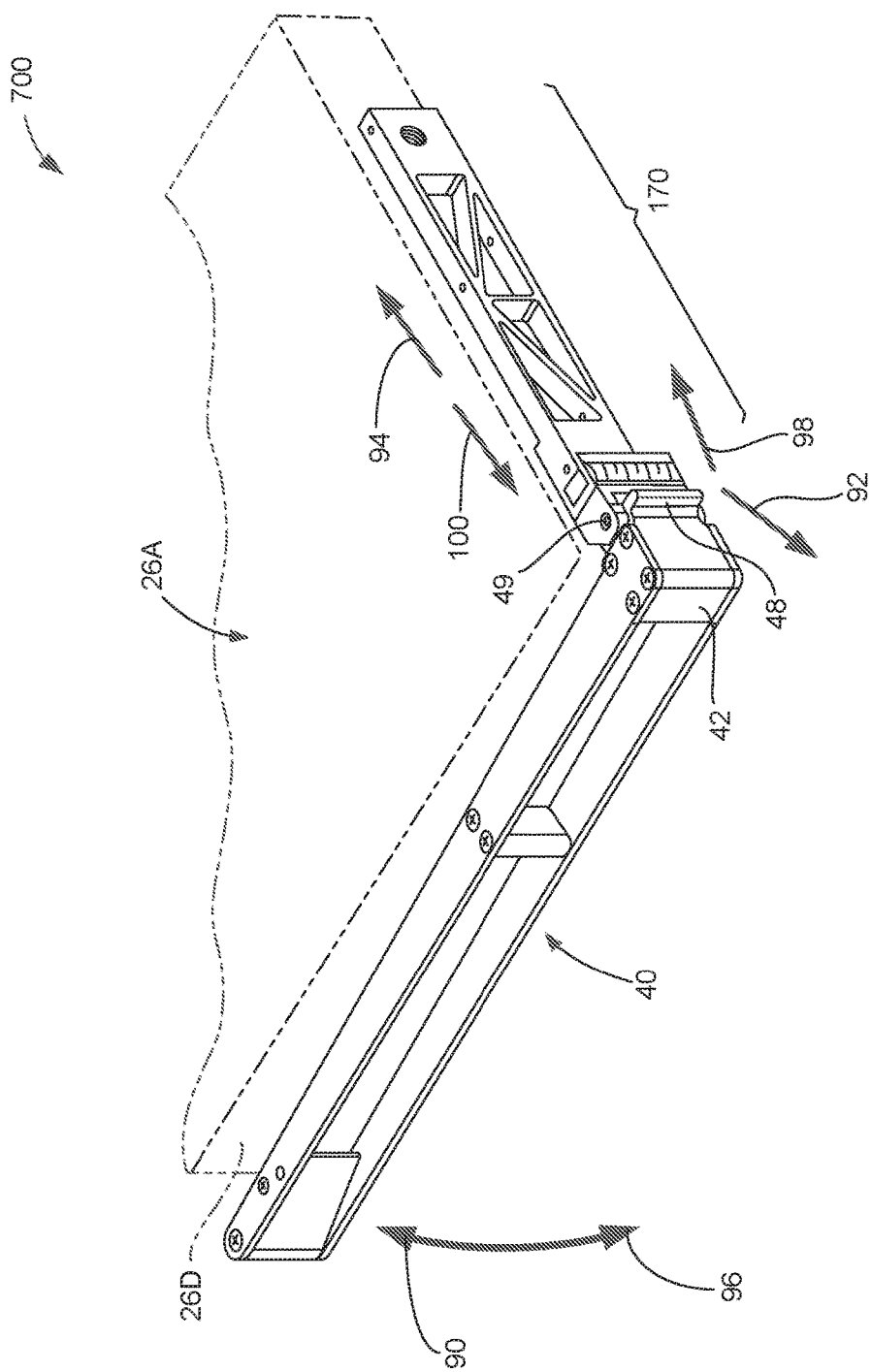
FIG. 7 is a perspective view illustrative of a card ejector mounted to a computer card in accordance with one or more example implementations and techniques described in this disclosure.

FIG. 7 is a perspective view illustrative of a card ejector 700 mounted to a card 26A in accordance with one or more example implementations and techniques described in this disclosure. Card ejector 700 comprises card ejector 40 that is rotatably coupled to siderail assembly 170. Siderail assembly 170 is secured in a fixed manner to illustrative card 26A. Card ejector 40 is configured to rotate in a first direction indicated by arrowhead 90, and in a second and opposite direction indicated by arrowhead 96, both directions relative to the rotational point provided by pin 49. Rotation of card ejector 40 in the direction indicated by arrowhead 90 causes cam 48 to rotate relative to pin 49 in a direction indicated by arrow 92, which, when cam 48 is engaged in a cam engagement block as described above, urges card 26 to move in the direction indicated by arrow 94 (i.e., moving card 26A in a direction to engage and ultimately to be fully inserted into a card socket). Rotation of card ejector 40 in the direction indicated by arrowhead 96 causes cam 48 to rotate relative to pin 49 in a direction indicated by arrow 98, which, when cam 48 is engaged in a cam engagement block as described above, urges card 26A to move in the direction indicated by arrow 100 (i.e., moving card 26A in a direction to be extracted from a card socket).

When card ejector 40 is fully moved in the direction indicated by arrowhead 90, a latching mechanism 46 of card ejector 40 will engage and latch to an opening (not shown in FIG. 7) in the face portion 26D of card 26A, securing card 26A in position relative to a card socket (also not shown in FIG. 7). As described above, when card ejector 40 is in the fully latched position, a tensional force in the direction of arrow 96 along the longitudinal axis of card ejector 40, in conjunction with the hook of latching mechanism 46, maintain the card ejector 40 in the fully latched position, and thus maintains card 26A in the fully inserted position. When an back force in a direction indicated by arrow 100 (as also shown in FIG. 4B) is exerted on card 26A, which for example would tend to unintentionally extract card 26A from a card socket, the over-center arrangement of latching mechanism 46 further urges the hook of the latching mechanism into the latching position, as opposed to urging the latching mechanism to unlatch, because the latching mechanism rotates in a same direction when latching as the card ejector 40 rotates when the back force illustrated by arrow 100 is being exerted on card 26A.

FIG. 8 is a partial view illustrative of a pair of card ejectors 800 at various stages of engagement with a face portion 26D of a card 26A in accordance with one or more example implementations and techniques described in this disclosure. Card ejectors 800 include a first card ejector 30 having a latching mechanism 36, and a second card ejector 40 having a latching mechanism 46. Card ejector 30 in various examples is any of card ejectors 30, 30A, 30B, and in various examples, card ejector 40 is any of card ejectors 40, 40A, and 40B as described in this disclosure, or the equivalents thereof, respectively.

As illustrated, in FIG. 8, the latching mechanism 36 of card ejector 30 includes a hook 156A that is partially engaged with an opening 26E in face portion 26D of card 26A. Engagement surfaces 160A of hook 156A are shown to be in contact with an edge of opening 26E, and thus latching mechanism 36 has been rotatably driven back (against the force exerted by a latching mechanism spring of latching mechanism 36) so that in some examples the latch release lever 150A of latching mechanism 36 aligns with a first edge 31A of card ejector 30. The contours provided by engagement surfaces 160A of hook 156A aid in providing the rotational forces needed to drive latching mechanism 36 to the position shown in FIG. 8, thus allowing hook 156A to continue to advance further through opening 26E in the direction of card 26A as indicated by arrow 801 when card ejector 30 is being manipulated toward the "latching position" as described herein.

As card ejector 30 is advanced in the direction indicated by arrow 801, at some point the latching surface 162A will extend through opening 26E and beyond face portion 26D. Once this has occurred, the spring mechanism (e.g., latching spring 152 shown in FIGS. 6A-B) of latching mechanism 36 will rotate the latching mechanism back to a position such that the release lever 150A aligns with a second edge 31B of card ejector 30 so that latching surface 162A extends to a position beyond an edge of opening 26E, and engages an inside surface of face portion 26D to latch the card ejector 30 in the latched position. In various examples, the angle of rotation of the latching mechanism between edge 31A and 31B is approximately nine degrees. In addition, because of the position of hook 156A relative to the rotational point of latching mechanism 36, e.g., the rotational point of latching mechanism 36 is closer to the distal end of card ejector 30 than the hook 156A, latching mechanism 36 provides over-center latching of the card ejector once the card ejector 30 is fully actuated to the latched position. As such, when card ejector 30 is in the latched position, any forces, including the tension forces provided in the card ejector 30 itself, tending to move the distal end of the card ejector 30 in a direction away from face portion 26D provide a rotational force on latching mechanism 36 and hook 156A in the direction of latching hook 156A with the inner surface of face portion 26D, as opposed to trying to rotate, and thus unlatch, the latching mechanism 36. This feature provides additional security against unintentional unlatching of card ejector 30.

The latched position for latching mechanism 36 and 46 is further illustrated by card ejector 40 and latching mechanism 46, wherein as illustrated with respect to card ejector 40, hook 156B of latching mechanism 46 is fully advanced into and through opening 26F of face portion 26D, and has been rotated to the latching position with respect to hook 156B so that the latching surface 162B of hook 156B engages and latches the card ejector 40 to the face portion 26D of card 26A.

When in the latching position, each of card ejector 30 and card ejector 40 may be held in tension along the longitudinal axis of the assembly, as previously described above (for example with respect to card ejector 30A and 40A shown in FIG. 2). When card 26A is intentionally being extracted from a card socket after having been inserted using card ejector 30 and card ejector 40, the latch release lever 150A can be actuated to unlatch card ejector 30, and the latch release lever 150B can be actuated to unlatch card ejector 40. By way of illustration, when a card ejector is in the fully latched position as shown by card ejector 40, an operator, such as a human operator, can actuate (rotate) latch release level 150B so that it assumes a position shown for latch release lever 150A, aligning with a first edge (such as edge 31A) of the card ejector. Actuation of these latch release levers 150A, B will cause the latching surfaces 162 (A, B respectively) to align with the opening 26E, F, respectively, in a position allowing engagement surfaces 162A, B to clear the edges of openings 26E and 26F, respectively, and align with these respective openings. Once latching surface 162A of latching mechanism 36 aligns with opening 26E, the tensional force discussed with respect to the card ejector when in the latched position will cause card ejector 30 to move away from the face portion 26D, and thus withdrawal hook 156A through and away from opening 26E. Similarly, once latching surface 162B of latching mechanism 46 aligns with opening 26F, the tensional force discussed with respect to the card ejector when in the latched position will cause card ejector 40 to move away from the face portion 26D, and thus withdrawal hook 156B through and away from opening 26F. Once the hooks 156A, B have cleared the opening for each card ejector, either card ejector, or both card ejectors in unison, can be further manipulated to extract card 26A as previously described. In addition, because of the position of hook 156B relative to the rotational point of latching mechanism 46, e.g., the rotational point of latching mechanism 46 is closer to the distal end of card ejector 40 than the hook 156B, latching mechanism 46 provides over-center latching of the card ejector once the card ejector 40 is fully actuated to the latched position. As such, when card ejector 40 is in the latched position, any forces, including the tension forces provided in the card ejector 40 itself, tending to move the distal end of the card ejector 40 in a direction away from face portion 26D provide a rotational force on latching mechanism 46 and hook 156B in the direction of latching the hook 156B with the inner surface of face portion 26D, as opposed to trying to rotate, and thus unlatch, the latching mechanism 46. This feature provides additional security against unintentional unlatching of card ejector 40.

In various examples, card 26A comprises one or more switches 164A, 164B. In some examples, switches 164A and/or switch 164B are micro-switches. When in the latched position shown for card ejector 40, switch 164B is positioned within card 26A so that the engagement surface 160B perpendicular to latching surface 162B of hook 156B actuates switch 164B while the hook 156B is fully engaged and latched with face portion 26D. In a similar manner, a switch 164A can be positioned to be actuated when hook 156A of card ejector 30 is fully engaged latched with face portion 26D. In various examples, when card 26 is powered, signals from switches 164A, 164B can be used to provide indications as to whether the card ejectors coupled to the card are fully and properly latched. In various examples, switches 164A, 164B may be coupled to indicators 166A, 166B, comprising indicator lights or some other type of visual display devices that provide a visual indication with respect to whether or not a card ejector associated with the visual indication is properly and fully latched in position relative to card 26A. In some examples, these visual indicators are located on the face portion 26D of card 26A, and are visible through the space (such as spaces 500A and 500B shown in FIG. 5B) between the level arms when the card ejector is in the latched position relative to card 26A.

In an alternative example, latching mechanisms 36 and 46 may be configured to latch and unlatch using a slide arrangement of hooks 156A, 156B, respectively, instead of being configured to be rotatable. For example, hook 156B of latching mechanism 46 may be configured to be urged by a spring, or some other resilient mechanism, so that hook 156B moves in a direction (e.g., to the left in FIG. 8) as indicated by arrow 803 when no other forces are applied to the latching mechanism in the direction indicated by arrow 802. In this example, when the engagement surface 160B of hook 156B engages opening 26F when card ejector 40 is being latched, the force exerted on hook 156B is configured to slide hook 156B in the direction indicated by arrow 802 (e.g., to the right as shown in FIG. 8). Movement of hook 156B in the direction of arrow 802 allow hooks 156B to be moved so that the hook 156 can clear the edge of opening 26F and be fully inserted through opening 26F. Once hook 156B clears the inside edge of opening 26F, the spring or other resilient mechanism of latching mechanism 46 urges hook 156B back in the direction of arrow 803 and into the latched position shown in FIG. 8 for latching mechanism 46. In this example, the lever release mechanism of latching mechanism 46 may be configured so that a force in the direction of arrow 802, exerted for example on the latching mechanism by an operator, overcomes the force of the spring or other resilient member, and moves hook 156B in the direction of arrow 802. Movement of hook 156B in the direction of arrow 802 in an amount adequate to allow latching surface 162B to clear the edge of opening 26F will allow hook 156B to be extracted from the opening 26F and to allow card ejector 40 to be unlatched from the face portion 26D of card 26A. This and other types of movements and latching arrangements are contemplated as being within the scope of the types and arrangements of latching mechanism that may be utilized in the card ejectors described herein and the equivalents thereof.

Figure 9:
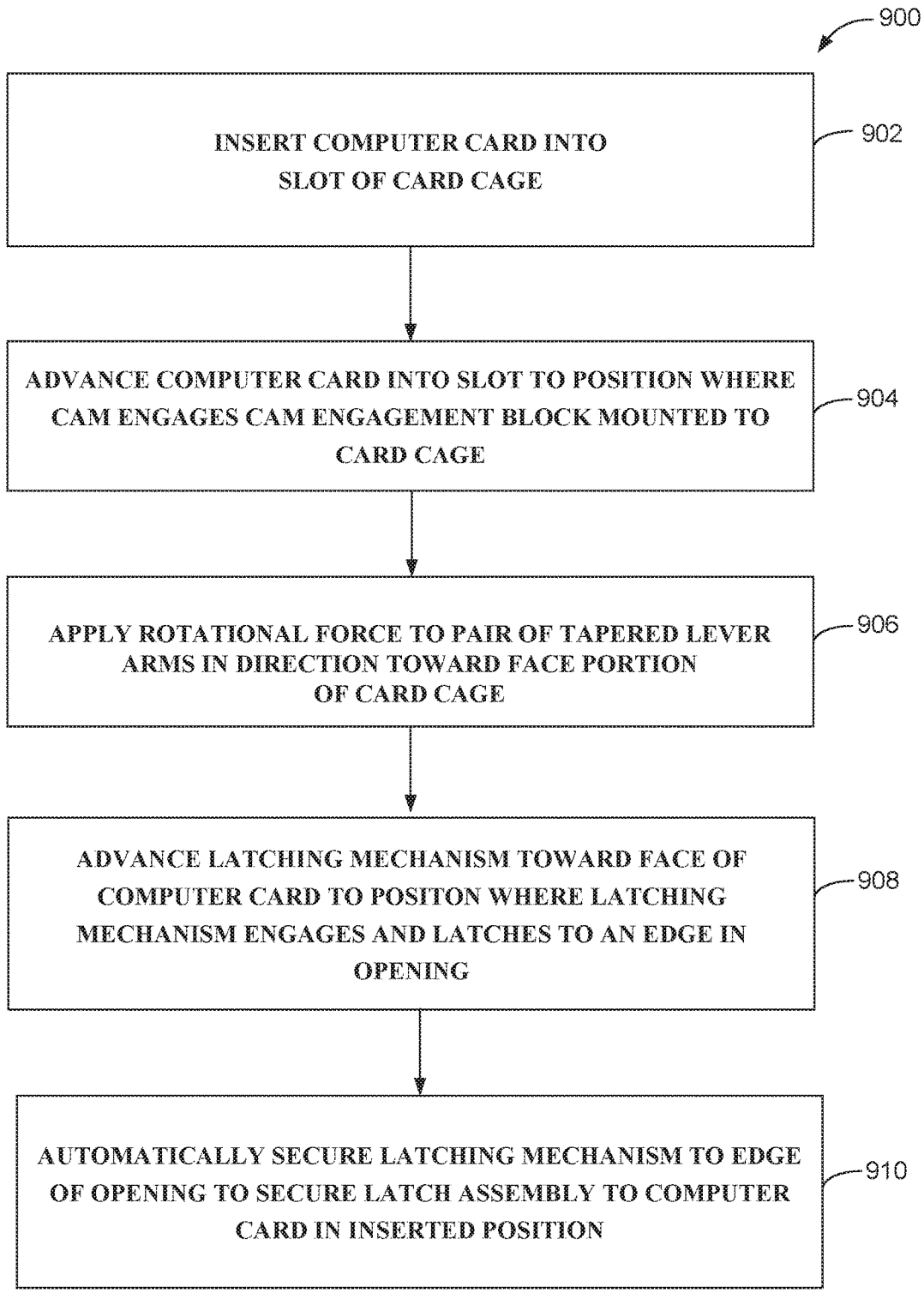
FIG. 9 illustrates an example method for operating card ejectors in accordance with one or more example implementations and techniques described in this disclosure.

FIG. 9 illustrates a method 900 for operating card ejectors in accordance with one or more example implementations and techniques described in this disclosure. In various examples, method 900 comprises the steps of inserting a computer card into a slot of a card cage (block 902), the computer card comprising at least one card ejector comprising a pair of tapered lever arms and a cam rotatably coupled to the computer card. Method 900 further comprises advancing the computer card into the slot to a position where the cam engages a cam engagement block mounted to the card cage (block 904). Method 900 further comprises applying a rotational force to the pair of tapered lever arms in a direction toward a face portion of the card cage, the pair of tapered lever arms configured to transfer the rotational force through the cam to the cam engagement block to insert the computer card into a card socket located in the slot (block 906), advancing a latching mechanism located on a distal end of the at least one card ejector toward the face of the computer card to a position where the latching mechanism engages and latches to an edge of an opening in the face of the computer card (block 908), and automatically securing, by a latching spring, the latching mechanism to the edge of the opening to secure the card ejector to the computer card in an inserted position within the slot forming an over-center latching arrangement relative to a hook and a center of rotation of the latching mechanisms (block 910).

Figure 10:
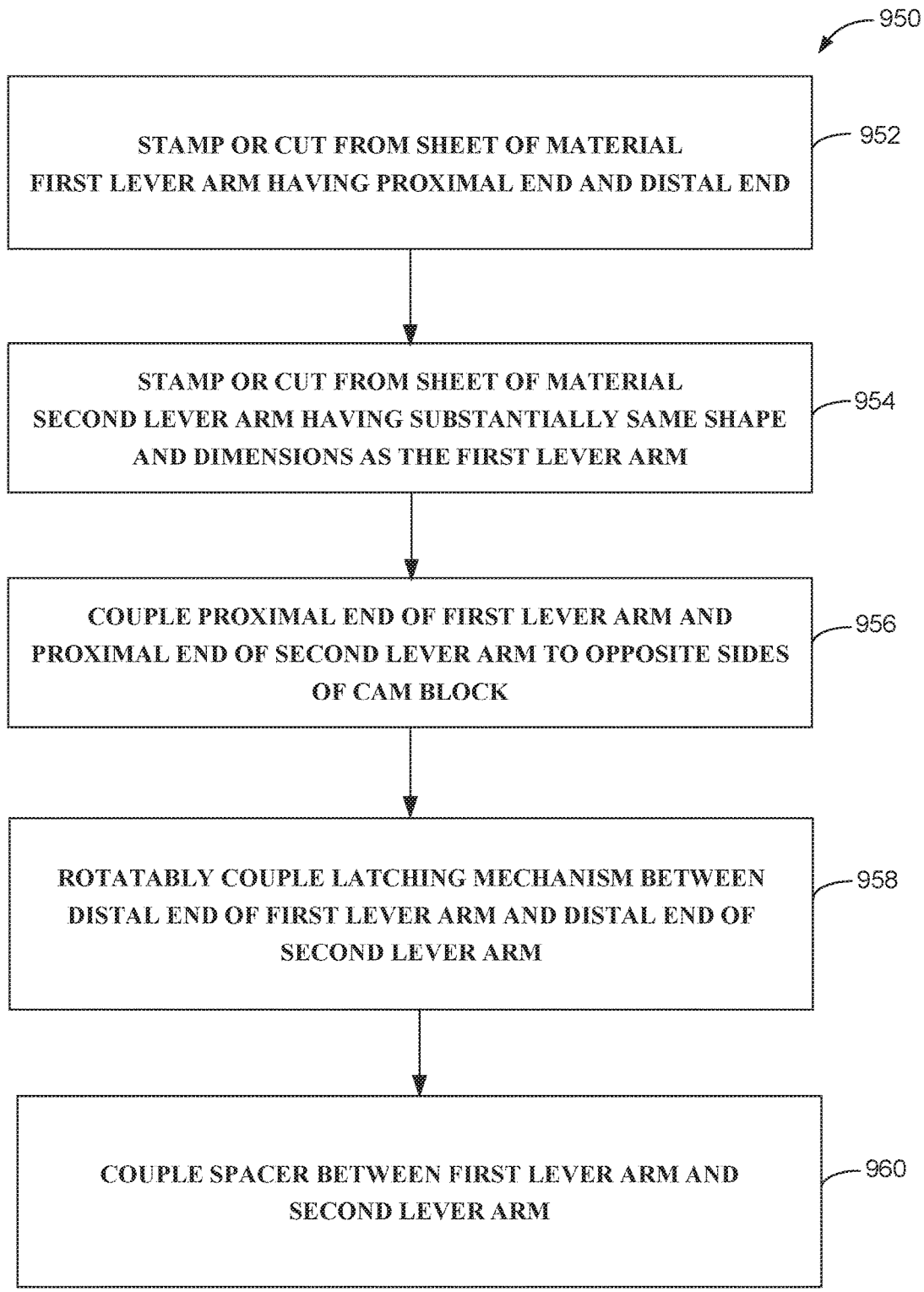
FIG. 10 illustrates an example method for manufacturing card ejectors in accordance with one or more example implementations and techniques described in this disclosure.

FIG. 10 illustrates an example method 950 for manufacturing card ejectors in accordance with one or more example implementations and techniques described in this disclosure. As illustrated in FIG. 10, a method of manufacturing a card ejector comprises stamping or cutting from a sheet of material a first lever arm having a proximal end and a distal end, and having a first width at the proximal end that tapers to a second width along a longitudinal axis to the distal end (block 952). The method of manufacturing further comprising stamping or cutting from the sheet of material a second lever arm having substantially the same shape and dimensions as the first lever arm (block 954). The method of manufacturing further comprising coupling the proximal end of the first lever arm and a proximal end of the second lever arm to opposite sides of a cam block (956), the cam block comprising a cam, and coupling the cam block in a position between the first and second level arms so that the cam extends beyond the area between the first and second lever arms and so that the first lever arm and the second lever arms are spaced apart from one and other. The method of manufacturing further comprises rotatably coupling a latching mechanism between the distal end of the first lever arm and a distal end of the second lever arm (block 958), the latching mechanism comprising a latch, and coupling the latching mechanism so that the latch extends beyond the area between the first lever arm and the second lever arm. In various examples, the method of manufacturing further comprises coupling a spacer between the first lever arm and the second lever arm at a position along the longitudinal axis and between the cam block and the latching mechanism (block 960).

In various examples, various alternative methods of manufacturing the lever arms of the card ejector include die casting and injection molding. In various examples, the cam block, spacer, and one or more devices included in the latching mechanism may be formed by extrusion, die-casting, injection molding, 3D-printing, and/or machining processes. In various examples, the hook portion of the latching mechanism may be formed by stamping or cutting, including laser-cutting processes, or may be molded as a feature that is integral to the latching mechanism.

The following examples describe one or more aspects of the disclosure.

Example 1

A device comprising: a card ejector comprising a pair of tapered lever arms coupled at a proximal end of the card ejector and coupled at a distal end of the card ejector; a cam block coupling the pair of tapered lever arms at the proximal end of the card ejector, the cam block rotatably coupled to a card and configured to engage a card cage, and urge the card into or out of the card cage when a rotational force is applied to the card ejector; and a latching mechanism coupling the pair of tapered lever arms at the distal end of the card ejector, the latching mechanism configured to automatically and releasably secure the distal end of the card ejector in a position near a face portion of the card by engaging an opening in the face portion.

Example 2

The device of example 1, wherein the latching mechanism is configured to place the pair of tapered lever arms in tension when the latching mechanism has latched to an edge of an opening in the face portion of the card while the card is fully inserted into the card cage.

Example 3

The device of either of examples 1 or 2, wherein the latching mechanism comprises a hook configured to provide an over-center latching arrangement relative to the card ejector when the latching mechanism is in the latching position relative to the card.

Example 4

The device of example 3, wherein the hook comprises a latch surface and an engagement surface perpendicular to the latch surface, the engagement surface configured actuate a switch within the card when the latching mechanism is in the latching position relative to the card.

Example 5

The device of any of examples 1-4, wherein each of the pair of tapered lever arms comprises planar material having a thickness and comprising an inside edge that extends from the proximal end to the distal end of the card ejector along a line parallel to a longitudinal axis of the card ejector, and an outside edge that extends from the proximal end to the distal end of the card ejector, the outside edge forming an angle relative to the longitudinal axis of the card ejector such that a first distance between the inside edge and the outside edge at the proximal end is greater than a second distance between the inside edge and the outside edge at the distal end.

Example 6

The device of any of examples 1-5, wherein the cam block comprises a cam extending from the cam block and beyond an area between the pair of tapered lever arms.

Example 7

The device of example 6, wherein the cam is configured to engage a cam engagement block mounted to the computer rack, and to transfer a rotational force applied to the pair of tapered lever arms to the cam engagement block to urge the card into or out of the card cage.

Example 8

The device of example 7, wherein the cam is configured to transfer a rotational force to the cam engagement block to urge the card to be inserted into a card socket when the rotational force applied to the pair of tapered lever arms is in a direction causing the distal end to move toward the face portion of the card.

Example 9

The device of examples 7 or 8, wherein the cam is configured to transfer a rotational force to the cam engagement block to urge the card to be extracted from a card socket when the rotational force applied to the pair of tapered lever arms is in a direction causing the distal end to move away from the face portion of the card.

Example 10

The device of any of examples 1-9, wherein the latching mechanism is rotatably coupled to the pair of tapered lever arms, the latching mechanism comprising a latch spring configured to urge the latching mechanism toward a latching position when no other rotational forces are applied to the latching mechanism.

Example 11

The device of any of examples 1-10, wherein the latching mechanism comprises a latch extending from the latching mechanism beyond the pair of tapered lever arms, the latch comprising one or more engagement surfaces configured to engage an edge of the opening in the face portion of the card when the distal end of the card ejector is rotated to a position near the face portion of the card, the engagement surfaces configured to exert a force against a latching spring and to rotate the latch toward a release position.

Example 12

The device of example 11, wherein the latching mechanism comprises a latching surface extending from the latch, the latching surface configured to engage and automatically latch to the edge of the opening in the face portion of the card when the latching mechanism is moved to a fully inserted position relative to the opening.

Example 13

The device of example 12, wherein the latching mechanism comprises a latch release lever configured to be actuated to urge the latching mechanism to an unlatching position and to allow a rotational force to be applied to the latch release lever to move the latch from the latching position to an unlatching position.

Example 14

The device of example 13, wherein the latch release lever is configured to allow an operator to apply the rotational force to the latch release lever to move the latching mechanism from the latching position to the unlatching position when the card ejector is in the latched position.

Example 15

The device of any of examples 1-14, wherein a latching spring is coupled to the latching mechanism and the latch release lever, and is configured to urge the latching mechanism to the latching position to automatically latch the latching mechanism and the card ejector to the face portion of the card when the card ejector is rotated to the latched position.

Example 16

The device of any of examples 1-15, wherein the pair of tapered lever arms are spaced apart from one another to form one or more spaces between the pair of tapered lever arms.

Example 17

The device of any of examples 1-16, wherein the pair of tapered lever arms are formed by stamping each of the pair of tapered lever arms from a sheet of metal.

Example 18

A method comprising: inserting a computer card into a slot of a card cage, the computer card comprising at least one card ejector comprising a pair of tapered lever arms and a cam rotatably coupled to the computer card; advancing the computer card into the slot to a position where the cam engages a cam engagement block mounted to the card cage; applying a rotational force to the pair of tapered lever arms in a direction toward a face portion of the card cage, the pair of tapered lever arms configured to transfer the rotational force through the cam to the cam engagement block to insert the computer card into a card socket located in the slot; advancing a latching mechanism located on a distal end of the at least one card ejector toward the face of the computer card to a position where the latching mechanism engages and latches to an edge of an opening in the face of the computer card; automatically securing, by a latching spring, the latching mechanism to the edge of the opening to secure the card ejector to the computer card in an inserted position within the slot forming an over-center latching arrangement between a hook and a rotational point of the latching mechanism.

Example 19

The method of example 18, further comprising: releasing the latching mechanism by applying a rotational force to move the latching mechanism from a latched position to an unlatched position; automatically advancing the tapered lever arms to a position wherein the latching mechanism is not engaged with the edge of the face of the computer card by releasing a tension stored in the pair of tapered lever arms while in a latched position; applying a further rotational force to the pair of tapered lever arms in a direction away from the face portion of the computer card, the pair of tapered lever arms configured to transfer the further rotational force through the cam to the cam engagement block to extract the computer card from the card socket located in the slot.

Example 20

A latching system for a computer card comprising: a computer card; a siderail coupled to a first side of the computer card, a card ejector rotatably coupled to the first side rail, the card ejector comprising a pair of tapered lever arms coupled by a cam block at a first end of the card ejector, the cam block configured to engage a first cam engagement block of a card cage to urge the computer card into or out of the computer cage when a rotational force is applied to the card ejector, and a latching mechanism coupling the pair of tapered lever arms at a second end of the card ejector, the latching mechanism configured to automatically and releasably secure the second end of the card ejector in a position near the face portion of the computer card by placing the pair of tapered lever arms in tension when the latching mechanism has urged the computer card into an inserted position within the card cage.

Example 21

The system of example 20, further comprising: a second siderail coupled to a second side of the computer card, the second side opposite the first side; a second card ejector rotatably coupled to the second side rail, the second card ejector comprising a second pair of tapered lever arms coupled by a second cam block at a first end of the second card ejector, the second cam block configured to engage a second cam engagement block of the card cage to urge the computer card into or out of the card cage when a rotational force is applied to the second card ejector, and a second latching mechanism coupling the second pair of tapered lever arms at a second end of the second card ejector, the second latching mechanism configured to automatically and releasably secure the second end of the second card ejector in a position near the face portion of the computer card by placing the second pair of tapered lever arms in tension when the second card ejector has urged the computer card into the inserted position within the card cage.

Example 22

The system of either examples 20 or 21, wherein the latching mechanism comprises a hook, the hook configured to provide an over-center latching configuration relative to a center of rotation of the latching mechanism.

Various aspects of this disclosure have been described. These and other aspects are within the scope of the following claims.

What is claimed is:

1. A device comprising:
a card ejector comprising a pair of tapered lever arms coupled at a proximal end of the card ejector and coupled at a distal end of the card ejector;
a cam block coupling the pair of tapered lever arms at the proximal end of the card ejector, the cam block rotatably coupled to a card and configured to engage a card cage, and urge the card into or out of the card cage when a rotational force is applied to the card ejector; and
a latching mechanism coupling the pair of tapered lever arms at the distal end of the card ejector, the latching mechanism configured to automatically and releasably secure the distal end of the card ejector in a position near a face portion of the card by engaging an opening in the face portion.

2. The device of claim 1, wherein the latching mechanism is configured to place the pair of tapered lever arms in tension when the latching mechanism has latched to an edge of an opening in the face portion of the card while the card is fully inserted into the card cage.

3. The device of claim 1, wherein the latching mechanism comprises a hook configured to provide an over-center latching arrangement relative to the card ejector when the latching mechanism is in the latching position relative to the card.

4. The device of claim 3, wherein the hook comprises a latch surface and an engagement surface perpendicular to the latch surface, the engagement surface configured actuate a switch within the card when the latching mechanism is in the latching position relative to the card.

5. The device of claim 1, wherein each of the pair of tapered lever arms comprises planar material having a thickness and comprising an inside edge that extends from the proximal end to the distal end of the card ejector along a line parallel to a longitudinal axis of the card ejector, and an outside edge that extends from the proximal end to the distal end of the card ejector, the outside edge forming an angle relative to the longitudinal axis of the card ejector such that a first distance between the inside edge and the outside edge at the proximal end is greater than a second distance between the inside edge and the outside edge at the distal end.

6. The device of claim 1, wherein the cam block comprises a cam extending from the cam block and beyond an area between the pair of tapered lever arms.

7. The device of claim 6, wherein the cam is configured to engage a cam engagement block mounted to the computer rack, and to transfer a rotational force applied to the pair of tapered lever arms to the cam engagement block to urge the card into or out of the card cage.

8. The device of claim 7, wherein the cam is configured to transfer the rotational force to the cam engagement block to urge the card to be inserted into a card socket when the rotational force applied to the pair of tapered lever arms is in a direction causing the distal end to move toward the face portion of the card.

9. The device of claim 7, wherein the cam is configured to transfer the rotational force to the cam engagement block to urge the card to be extracted from a card socket when the rotational force applied to the pair of tapered lever arms is in a direction causing the distal end to move away from the face portion of the card.

10. The device of claim 1, wherein the latching mechanism is rotatably coupled to the pair of tapered lever arms, the latching mechanism comprising a latch spring configured to urge the latching mechanism toward a latching position when no other rotational forces are applied to the latching mechanism.

11. The device of claim 1, wherein the latching mechanism comprises a latch extending from the latching mechanism beyond the pair of tapered lever arms, the latch comprising one or more engagement surfaces configured to engage an edge of the opening in the face portion of the card when the distal end of the card ejector is rotated to a position near the face portion of the card, the engagement surfaces configured to exert a force against a latching spring and to rotate the latch toward a release position.

12. The device of claim 11, wherein the latching mechanism comprises a latching surface extending from the latch, the latching surface configured to engage and automatically latch to the edge of the opening in the face portion of the card when the latching mechanism is moved to a fully inserted position relative to the opening.

13. The device of claim 12, wherein the latching mechanism comprises a latch release lever configured to be actuated to urge the latching mechanism to an unlatching position and to allow a rotational force to be applied to the latch release lever to move the latch from the latching position to an unlatching position.

14. The device of claim 13, wherein the latch release lever is configured to allow an operator to apply the rotational force to the latch release lever to move the latching mechanism from the latching position to the unlatching position when the card ejector is in the latched position.

15. The device of claim 1, wherein a latching spring is coupled to the latching mechanism and the latch release lever, and is configured to urge the latching mechanism to the latching position to automatically latch the latching mechanism and the card ejector to the face portion of the card when the card ejector is rotated to the latched position.

16. The device of claim 1, wherein the pair of tapered lever arms are spaced apart from one another to form one or more spaces between the pair of tapered lever arms.

17. The device of claim 1, wherein the pair of tapered lever arms are formed by stamping each of the pair of tapered lever arms from a sheet of metal.

18. A method comprising:
inserting a computer card into a slot of a card cage, the computer card comprising at least one card ejector comprising a pair of tapered lever arms and a cam rotatably coupled to the computer card;
advancing the computer card into the slot to a position where the cam engages a cam engagement block mounted to the card cage;
applying a rotational force to the pair of tapered lever arms in a direction toward a face portion of the card cage, the pair of tapered lever arms configured to transfer the rotational force through the cam to the cam engagement block to insert the computer card into a card socket located in the slot;
advancing a latching mechanism located on a distal end of the at least one card ejector toward the face of the computer card to a position where the latching mechanism engages and latches to an edge of an opening in the face of the computer card;
automatically securing, by a latching spring, the latching mechanism to the edge of the opening to secure the card ejector to the computer card in an inserted position within the slot forming an over-center latching arrangement between a hook and a rotational point of the latching mechanism.

19. The method of claim 18, further comprising:
releasing the latching mechanism by applying a rotational force to move the latching mechanism from a latched position to an unlatched position;
automatically advancing the tapered lever arms to a position wherein the latching mechanism is not engaged with the edge of the face of the computer card by releasing a tension stored in the pair of tapered lever arms while in a latched position;
applying a further rotational force to the pair of tapered lever arms in a direction away from the face portion of the computer card, the pair of tapered lever arms configured to transfer the further rotational force through the cam to the cam engagement block to extract the computer card from the card socket located in the slot.

20. A latching system for a computer card comprising:
a computer card;
a siderail coupled to a first side of the computer card,
a card ejector rotatably coupled to the first side rail, the card ejector comprising a pair of tapered lever arms coupled by a cam block at a first end of the card ejector, the cam block configured to engage a first cam engagement block of a card cage to urge the computer card into or out of the computer cage when a rotational force is applied to the card ejector, and a latching mechanism coupling the pair of tapered lever arms at a second end of the card ejector, the latching mechanism configured to automatically and releasably secure the second end of the card ejector in a position near the face portion of the computer card by placing the pair of tapered lever arms in tension when the latching mechanism has urged the computer card into an inserted position within the card cage.

21. The system of claim 20, further comprising:
a second siderail coupled to a second side of the computer card, the second side opposite the first side;
a second card ejector rotatably coupled to the second side rail, the second card ejector comprising a second pair of tapered lever arms coupled by a second cam block at a first end of the second card ejector, the second cam block configured to engage a second cam engagement block of the card cage to urge the computer card into or out of the card cage when a rotational force is applied to the second card ejector, and a second latching mechanism coupling the second pair of tapered lever arms at a second end of the second card ejector, the second latching mechanism configured to automatically and releasably secure the second end of the second card ejector in a position near the face portion of the computer card by placing the second pair of tapered lever arms in tension when the second card ejector has urged the computer card into the inserted position within the card cage.

22. The system of claim 20, wherein the latching mechanism comprises a hook, the hook configured to provide an over-center latching configuration relative to a center of rotation of the latching mechanism.

* * * * *